(12) United States Patent
Irving et al.

(10) Patent No.: US 11,747,731 B2
(45) Date of Patent: Sep. 5, 2023

(54) CURING A SHAPED FILM USING MULTIPLE IMAGES OF A SPATIAL LIGHT MODULATOR

(71) Applicant: CANON KABUSHIKI KAISHA, Tokyo (JP)

(72) Inventors: James W. Irving, Austin, TX (US); Edward Brian Fletcher, Austin, TX (US); Nilabh Kumar Roy, Austin, TX (US)

(73) Assignee: CANON KABISHIKI KAISHA, Tokyo (JP)

( * ) Notice: Subject to any disclaimer, the term of this patent is extended or adjusted under 35 U.S.C. 154(b) by 40 days.

(21) Appl. No.: 17/100,477

(22) Filed: Nov. 20, 2020

(65) Prior Publication Data

US 2022/0163893 A1    May 26, 2022

(51) Int. Cl.
```
G03F  7/20     (2006.01)
G03F  7/00     (2006.01)
G02B 27/12     (2006.01)
H04N  9/31     (2006.01)
```
(52) U.S. Cl.
CPC ........... *G03F 7/2004* (2013.01); *G02B 27/12* (2013.01); *G03F 7/0002* (2013.01); *H04N 9/312* (2013.01)

(58) Field of Classification Search
CPC .................. G02B 27/12; G03F 7/2004; G03F 2007/2067; G03F 7/0002; H04N 9/312
See application file for complete search history.

(56) References Cited

U.S. PATENT DOCUMENTS

| | | |
|---|---|---|
| 6,870,554 B2 | 3/2005 | Jain |
| 6,922,483 B2 | 7/2005 | Doane |
| 6,936,194 B2 | 8/2005 | Watts |

(Continued)

FOREIGN PATENT DOCUMENTS

| | | |
|---|---|---|
| JP | 2011181548 A | 9/2011 |
| JP | 2013110196 A | 6/2013 |

(Continued)

OTHER PUBLICATIONS

Amir Tavakkoli Kermani Ghariehali, Mehul N. Patel, Edward Brian Fletcher, U.S. Appl. No. 16/428,166, filed May 31, 2019.

(Continued)

*Primary Examiner* — Deoram Persaud
(74) *Attorney, Agent, or Firm* — Daniel Ratoff

(57) ABSTRACT

A shaping system and method of shaping with the shaping system. The shaping system may include a spatial light modulator. The shaping system may include a radiation source to illuminate the spatial light modulator with actinic radiation. The shaping system may include a beam splitter configured to receive actinic radiation from the spatial light modulator and emit a first image of the spatial light modulator and a second image of the spatial light modulator. The shaping system may include a beam combiner configured to receive the first image and the second image and emit a combined image. The combined image may include the first image; and the second image offset from the first image. The shaping system may include a projection system configured to receive the combined image and illuminate formable material between a template and a substrate with a projected image at a plane of the formable material.

20 Claims, 19 Drawing Sheets

(56) References Cited

U.S. PATENT DOCUMENTS

| | | |
|---|---|---|
| 7,157,036 B2 | 1/2007 | Choi et al. |
| 8,011,916 B2 | 9/2011 | Suehira et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 8,480,946 B2 | 7/2013 | Mikami et al. |
| 8,609,326 B2 | 12/2013 | Sreenivasan et al. |
| 8,641,958 B2 | 2/2014 | Khusnatdinov et al. |
| 9,110,380 B2 | 8/2015 | Werschnik et al. |
| 9,971,249 B1 | 5/2018 | Bamesberger et al. |
| 10,663,869 B2 | 5/2020 | Khusnatdinov et al. |
| 2003/0138704 A1 | 7/2003 | Mei et al. |
| 2006/0266916 A1 | 11/2006 | Miller et al. |
| 2010/0096764 A1 | 4/2010 | Lu |
| 2013/0078821 A1 | 3/2013 | Furutono |
| 2013/0234371 A1 | 9/2013 | Yamaguchi et al. |
| 2014/0272174 A1 | 9/2014 | Furutono |
| 2014/0340660 A1 | 11/2014 | Suzuki et al. |
| 2015/0004275 A1 | 1/2015 | Miyajima et al. |
| 2015/0118847 A1 | 4/2015 | Mikami |
| 2016/0136872 A1 | 5/2016 | Yanagisawa |
| 2018/0004091 A1 | 1/2018 | Shinoda |
| 2018/0149969 A1* | 5/2018 | Sato ................... G03F 7/0002 |
| 2018/0210346 A1 | 7/2018 | Laidig et al. |
| 2018/0348645 A1* | 12/2018 | Ravensbergen .... G03F 7/70625 |
| 2019/0101823 A1 | 4/2019 | Patel et al. |
| 2020/0070280 A1 | 3/2020 | Gauch et al. |
| 2020/0073232 A1 | 3/2020 | Tavakkoli Kermani Ghariehali |
| 2021/0124274 A1* | 4/2021 | Roy ..................... G03F 7/0002 |
| 2021/0181621 A1* | 6/2021 | Fletcher ............... G03F 7/0002 |

FOREIGN PATENT DOCUMENTS

| | | |
|---|---|---|
| JP | 2014188869 A | 10/2014 |
| JP | 2015106670 A | 6/2015 |
| JP | 2016058735 A | 4/2016 |
| JP | 2017147283 A | 8/2017 |
| JP | 2018014483 A | 1/2018 |
| WO | 2019065250 A1 | 4/2019 |
| WO | 2019078060 A1 | 4/2019 |

OTHER PUBLICATIONS

Nilabh K. Roy, Anshuman Cherala, U.S. Appl. No. 16/661,281, filed Oct. 23, 2019.

Amir Tavakkoli Kermani Ghariehali, Edward Brian Fletcher, U.S. Appl. No. 16/661,461, filed Oct. 23, 2019.

Edward Brian Fletcher, James W. Irving, Nilabh K. Roy, U.S. Appl. No. 16/712,406, filed Dec. 12, 2019.

Anshuman Cherala, Nilabh K. Roy, U.S. Appl. No. 16/719,280, filed Dec. 18, 2019.

Nilabh K. Roy, Anshuman Cherala, U.S. Appl. No. 16/835,039, filed Mar. 30, 2020.

* cited by examiner

CURING A SHAPED FILM USING MULTIPLE IMAGES OF A SPATIAL LIGHT MODULATOR

BACKGROUND OF INVENTION

Technical Field

The present disclosure relates to systems and methods for curing a shaped film using multiple images of a spatial light modulator.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid that may have been deposited as a drop pattern causing the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a shaping system. The shaping system may comprise a spatial light modulator. The shaping system may further comprise a radiation source configured to illuminate the spatial light modulator with actinic radiation. The shaping system may further comprise a beam splitter configured to receive actinic radiation from the spatial light modulator and emit a first image of the spatial light modulator and a second image of the spatial light modulator. The shaping system may further comprise a beam combiner configured to receive the first image and the second image and emit a combined image. The combined image may include the first image; and the second image is offset from the first image. The shaping system may further comprise a projection system configured to receive the combined image and illuminate formable material between a template and a substrate with a projected image at a plane of the formable material.

In an aspect of the first embodiment, the spatial light modulator may have a plurality of modulation elements. A modulation element pitch is a shortest distance between neighboring modulation elements among the plurality of modulation elements. The projected image may include a first projected image of the spatial light modulator having a first pitch that is shortest distance between images of neighboring modulation elements in the first projected image at the plane of the formable material. The projected image may also include a second projected image of the spatial light modulator having a second pitch that is shortest distance between images of neighboring modulation elements in the second projected image at the plane of the formable material. The first projected image may be offset from the second projected image by half of the first pitch.

In an aspect of the first embodiment, a percent difference between the first pitch and the second pitch is less than 3%.

The first embodiment, may further comprise a tilted window that controls the offset of the second image relative to the first image.

The first embodiment, may further comprise one or more mirrors arranged to guide the second image to the beam combiner such that the second image is offset from the first image at the beam combiner.

In an aspect of the first embodiment, the spatial light modulator may be one of: a digital micromirror device (DMD); a liquid crystal on silicon (LCoS) device; or a liquid crystal display (LCD).

In an aspect of the first embodiment, the beam splitter may be a first surface of an optical component. In addition, the beam combiner may be a second surface of the optical component.

In an aspect of the first embodiment, the optical component may include a plurality of surfaces which guide the second image to the second surface such that the second image is offset from the first surface at the second surface.

In an aspect of the first embodiment, the beam splitter may be a polarizing beam splitter. In addition, the beam combiner may be a polarization beam combiner.

In an aspect of the first embodiment, the beam splitter may be a cube beam splitter or a plate beam splitter.

The first embodiment, may further comprise a thermal radiation source configured to illuminate the spatial light modulator with thermal radiation. The first image may travel along a first path between the beam splitter and the beam combiner. The beam splitter may be further configured to receive thermal radiation from the spatial light modulator and emit a third image of the spatial light modulator along the first path towards the beam splitter. A first ratio is an intensity of the actinic radiation in the first image emitted by the beam splitter divided by an intensity of actinic radiation received by the beam splitter. A second ratio is an intensity of the thermal radiation in the third image emitted by the beam splitter divided by an intensity of thermal radiation received by the beam splitter. The second ratio may be at least 30% greater than the first ratio.

The first embodiment, may further comprise a template chuck configured to hold the template. The first embodiment may further comprise a substrate chuck configured to hold the substrate. The first embodiment may further comprise a dispensing system configured to dispense the formable material onto the substrate. The first embodiment may further comprise a positioning system configured to bring the template into contact with formable material. The first embodiment may further comprise a second actinic radiation source configured to supply additional actinic radiation to the formable material between the template and the substrate to cure the formable material.

The first embodiment, may further comprise one or more optical components between the beam splitter and the beam combiner. The one or more optical components may adjust a first set of optical properties at the plane of the formable material of the first image to be different than a second set of optical properties at the plane of the formable material of the second image.

In an aspect of the first embodiment, the first set of the optical properties may include a first distance between a focal plane of the first image and the plane of the formable material. The second set of the optical properties may include a second distance between a focal plane of the second image and the plane of the formable material. The first distance may be different from the second distance.

In an aspect of the first embodiment, the first set of the optical properties may include a first position of the first image at the plane of the formable material. The second set of the optical properties may include a second position of the second image at the plane of the formable material. A difference between the first position and the second position may be a projected lateral beam displacement.

In an aspect of the first embodiment, the first set of the optical properties may include a first projected pitch between the images of modulation elements in the first image at the plane of the formable material. The second set of the optical properties may include a second projected pitch between the images of modulation elements in the second image at the plane of the formable material. A percent difference between the first projected pitch and the second projected pitch may be less than 3%.

In an aspect of the first embodiment, the first set of the optical properties may include: a first average distance of a focal plane of the first image from the plane of the formable material; and a first size of the first image at the plane of the formable material. The second set of the optical properties may include: a second average distance of a focal plane of the second image from the plane of the formable material; and a second size of the second image at the plane of the formable material. The first average distance may be greater than the second average distance. The first size may be less than the second size.

In an aspect of the first embodiment, the one or more optical components may include an aperture which reduces a size of the first image.

A second embodiment, may be a shaping method. The shaping method may comprise illuminating a spatial light modulator with actinic radiation. The shaping method may further comprise receiving, by a beam splitter, actinic radiation from the spatial light modulator. The shaping method may further comprise emitting, by the beam splitter, a first image of the spatial light modulator and a second image of the spatial light modulator. The shaping method may further comprise receiving, by a beam combiner, the first image and the second image. The shaping method may further comprise emitting, by the beam combiner, a combined image. The combined image may include the first image; and the second image is offset from the first image. The shaping method may further comprise receiving, by a projection system, the combined image. The shaping method may further comprise illuminating, by the projection system, formable material between a template and a substrate with a projected image at a plane of the formable material.

The second embodiment, may also include a method of manufacturing an article using the shaping method. In which illuminating the formable material with actinic radiation causes the formable material to be cured. The method of manufacturing the article may comprise processing the cured formable material on the substrate. The method of manufacturing the article may further comprise forming the article from the processed substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
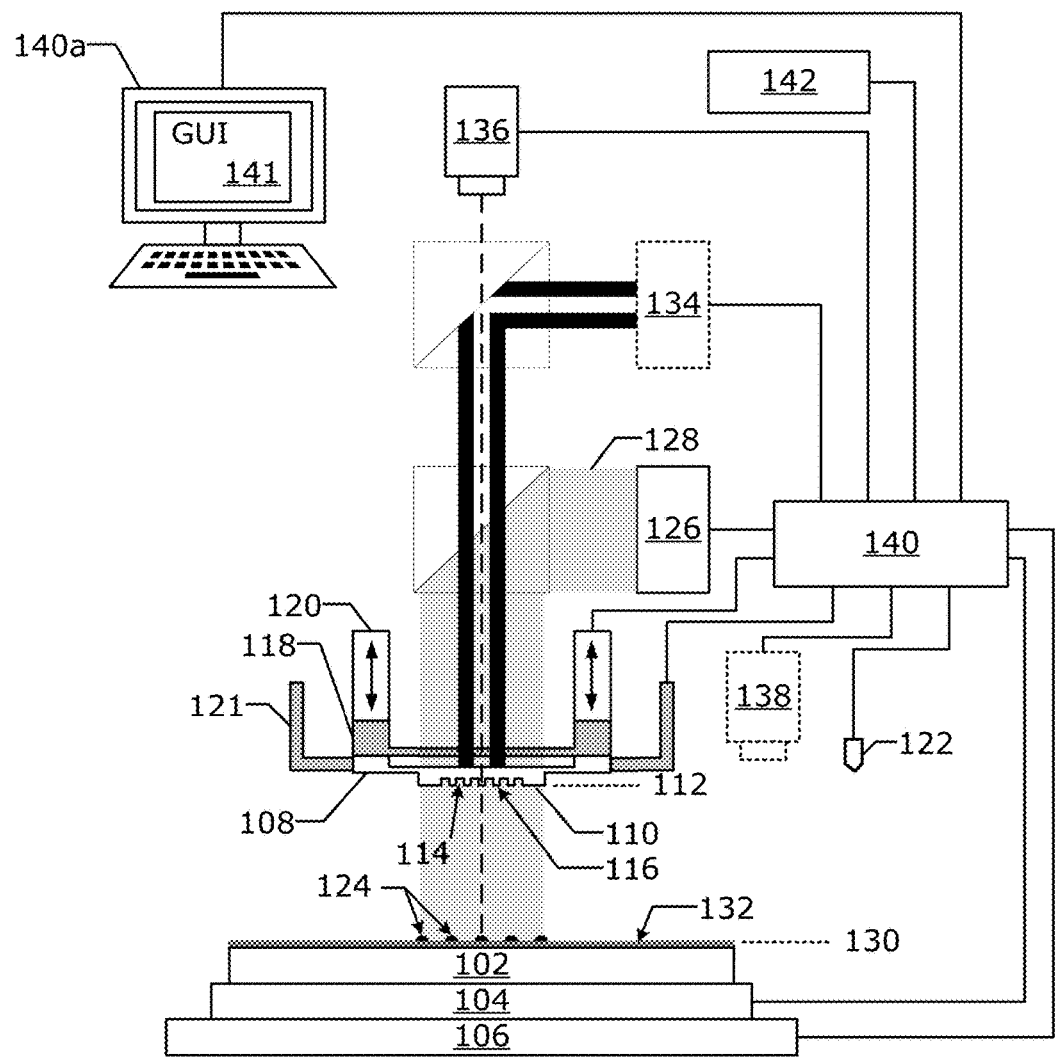
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprint lithography technique can be used to shape a film on a substrate from a formable material. The shaping process includes bringing a shaping surface (patterning surface) of a template into contact with formable material on a substrate. The shaping process also includes exposing the formable material to actinic radiation which causes the formable material to cure.

The applicant has found it useful to have precise control over the spatio-temporal distribution of the actinic radiation during the curing process. One method of having precise control over the actinic radiation is to use a spatial light modulator (SLM) that has a plurality of modulation elements. Each modulation element of the SLM can be individually controlled. Which allows adjustment of the spatio-temporal distribution of the actinic radiation on a modulation element by modulation element basis. The SLM is configured to transform a beam of radiation from a radiation source into a set of beamlets. Each beamlet is associated with a modulation element of the SLM.

The SLM can add unwanted artifacts to the spatio-temporal distribution of the actinic radiation due to inter-element variations in the intensity (reductions in intensity between beamlets). What is needed are systems and/or methods for compensating for these inter-element variations while still maintaining the advantages of SLMs ability to control spatio-temporal distribution of the actinic radiation.

Nanoimprint System (Shaping System)

FIG. 1 is an illustration of a shaping system 100 (nanoimprint lithography system) in which an embodiment may be implemented. The shaping system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and ϕ-axes. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a template 108. The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a patterning surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mold 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to a vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators 121 which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head 120 may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and ϕ-axes).

The shaping system 100 may further comprise a fluid dispenser 122. The fluid dispenser 122 may also be moveably coupled to the bridge. In an embodiment, the fluid dispenser 122 and the imprint head 120 share one or more or all of the positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a drop pattern. Additional formable material 124 may also be added to the substrate 102 using techniques, such as drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed on to the substrate 102 before and/or after a desired volume is defined between the shaping surface 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The shaping system 100 may further comprise a curing system that induces a phase change in the liquid formable material into a solid material whose top surface is determined by the shape of the shaping surface 112. The curing system may include at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. In an embodiment, the actinic energy may be directed through both the template chuck 118 and the template 108 into the formable material 124 under the template 108. In an embodiment, the actinic energy produced by the radiation source 126 is UV light that induces polymerization of monomers in the formable material 124.

The shaping system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the shaping system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of: a CCD; a sensor array; a line camera; and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting (shaping) process. The field camera 136 may also be configured to measure interference fringes, which change as the formable material spreads 124 between the gap between the shaping surface 112 and the substrate surface 130.

The shaping system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the shaping surface 112 contacting the formable material 124 on the substrate 102. In an alternative embodiment, the field camera 136 may be configured as a droplet inspection system 138 and used prior to the shaping surface 112 contacting the formable material 124

The shaping system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator (SLM) such as a digital micromirror device (DMD), Liquid Crystal on Silicon (LCoS), Liquid Crystal Device (LCD), etc., to modulate the spatio-temporal distribution of thermal radiation. The shaping system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, drop dispense, slot dispense, etc. In an embodiment, the substrate 102 may be a semiconductor wafer. In another embodiment, the substrate 102 may be a blank template (replica blank) that may be used to create a daughter template after being imprinted.

The shaping system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The shaping system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 140 may include a plurality of processors that are both included in the shaping system 100a and in communication with the shaping system 100a. The processor 140 may be in communication with a networked computer 140a on which analysis is performed and control files such as a drop pattern are generated. In an embodiment, there are one or more graphical user interface (GUI) 141 on one or both of the networked computer 140a and a display in communication with the processor 140 which are presented to an operator and/or user.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the shaping system 100 uses a shaping process to form the patterned layer which has recesses and protrusions (pillars) which are an inverse of the pattern in the shaping surface 112. In an alternative embodiment, the shaping system 100 uses a shaping process to form a planar layer with a featureless shaping surface 112.

The shaping process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the shaping surface 112 in each imprint field. The patterned layer may also include one or more features such as protrusions (pillars) which extend above the residual layer having a thickness. These protrusions match the recesses 114 in the mesa 110.

Template

Figure 2:
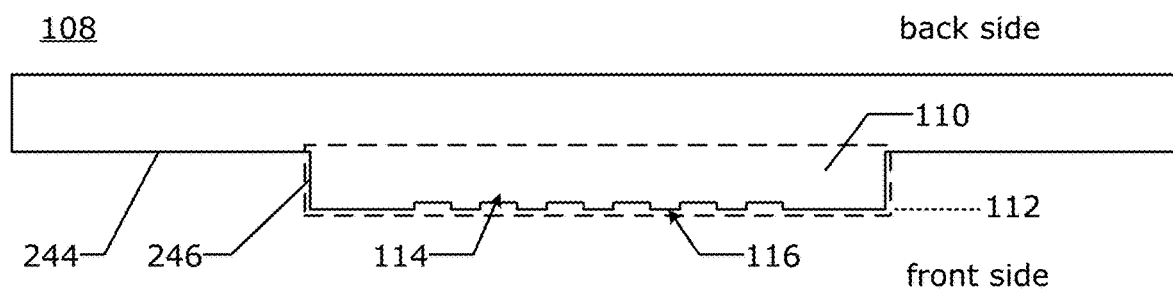
FIG. 2 is an illustration of an exemplary template that may be used in an embodiment.

FIG. 2 is an illustration of a template 108 (not to scale) that may be used in an embodiment. The shaping surface 112 may be on a mesa 110 (identified by the dashed box in FIG. 2). The mesa 110 is surrounded by a recessed surface 244 on the front side of the template. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners. In an embodiment, the mesa sidewalls 246 may have one or more of: a perpendicular profile; an angled profile; a curved profile; a staircase profile; a sigmoid profile; a convex profile; or a profile that is combination of those profiles.

Shaping Process

Figure 3:
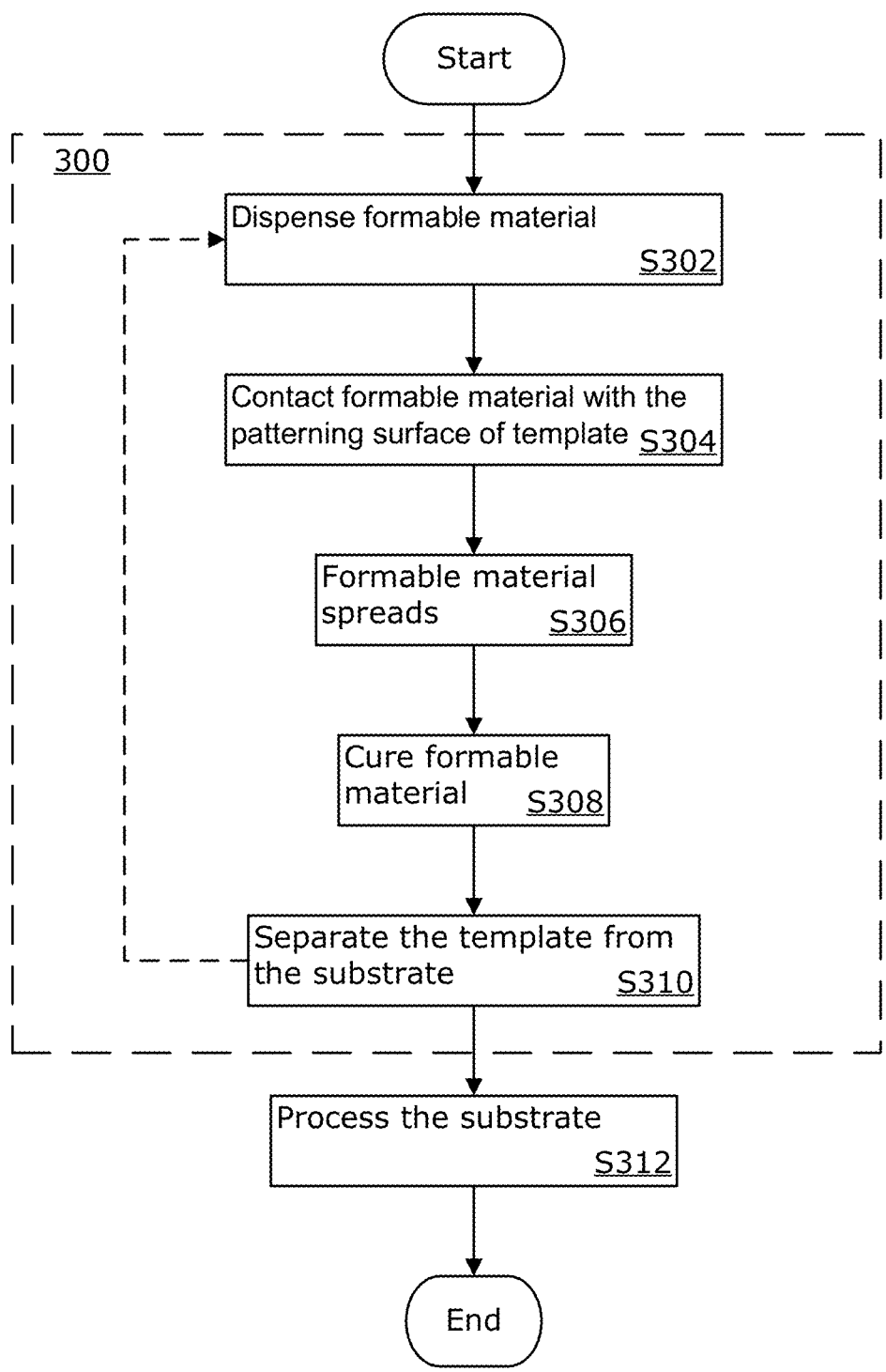
FIG. 3 is a flowchart illustrating an exemplary imprinting method as used in an embodiment.

FIG. 3 is a flowchart of a method of manufacturing an article (device) that includes a shaping process 300 by the shaping system 100 that can be used to form patterns in formable material 124 on one or more imprint fields (also referred to as: pattern areas or shot areas). The shaping process 300 may be performed repeatedly on a plurality of substrates 102 by the shaping system 100. The processor 140 may be used to control the shaping process 300.

In an alternative embodiment, the shaping process 300 is used to planarize the substrate 102. In which case, the shaping surface 112 is featureless and may also be the same size or larger than the substrate 102.

The beginning of the shaping process 300 may include a template mounting step causing a template conveyance mechanism to mount a template 108 onto the template chuck 118. The shaping process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the shaping system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by a shaping field index i. In which N is the number of shaping fields and is a real positive integer such as 1, 10, 62, 75, 84, 100, etc. $\{N \in \mathbb{Z}^+\}$. In a dispensing step S302, the processor 140 may cause the fluid dispenser 122 to dispense formable material based on a drop pattern onto an imprinting field. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field may be moved relative to the fluid dispenser 122 while the fluid dispenser is ejecting formable material 124. Thus, the time at which some of the droplets land on the substrate may vary across the imprint field i.

In an embodiment, during the dispensing step S302, the formable material 124 is dispensed onto the substrate 102 in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in a particular imprint field.

During a spreading step S306, the formable material 124 then spreads out towards the edge of the imprint field and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110, and the shaping surface 112. The curing illumination pattern provides enough energy to cure (polymerize) the formable material 124 under the shaping surface 112.

In a separation step S310, the processor 140 uses one or more of the substrate chuck 104, the substrate positioning stage 106, template chuck 118, and the imprint head 120 to separate the shaping surface 112 of the template 108 from the cured formable material on the substrate 102. If there are additional imprint fields to be imprinted, then the process moves back to step S302. In an alternative embodiment, during step S302 two or more imprint fields receive formable material 124 and the process moves back to steps S302 or S304.

In an embodiment, after the shaping process 300 is finished additional semiconductor manufacturing processing is performed on the substrate 102 in a processing step S312 so as to create an article of manufacture (e.g. semiconductor device). In an embodiment, each imprint field includes a plurality of devices.

The additional semiconductor manufacturing processing in processing step S312 may include etching processes to transfer a relief image into the substrate that corresponds to the pattern in the patterned layer or an inverse of that pattern. The additional processing in processing step S312 may also include known steps and processes for article fabrication, including, for example, inspection, curing, oxidation, layer formation, deposition, doping, planarization, etching, formable material removal, dicing, bonding, packaging, mounting, circuit board assembly, and the like. The substrate 102 may be processed to produce a plurality of articles (devices).

Configuration of some Optical Components in the Shaping System

Figure 4A:
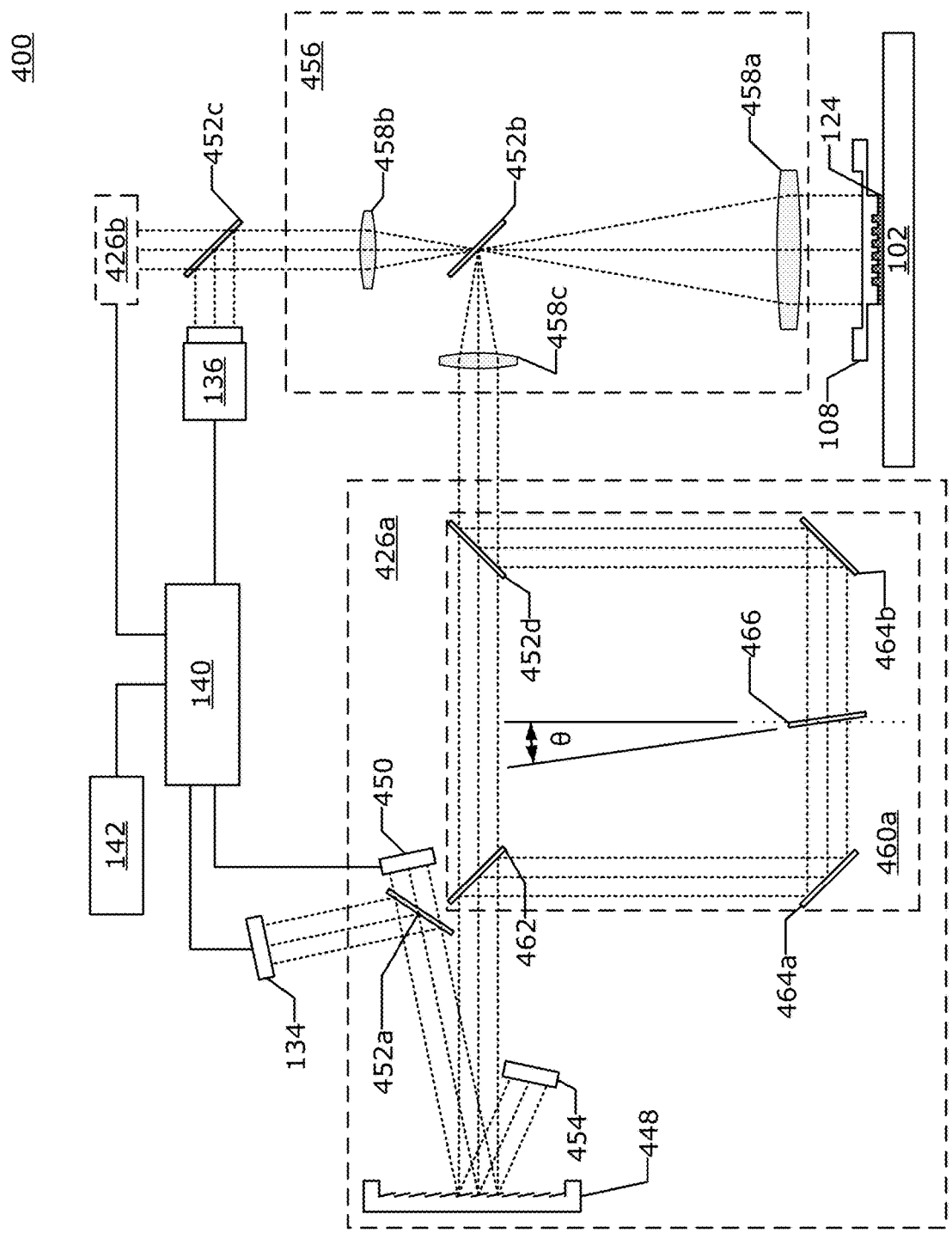
FIGS. 4A-B and D-G are illustrations of portions of an exemplary nanoimprint lithography system as used in an embodiment.

FIG. 4A is an illustration of a shaping system 400 (nanoimprint lithography system) that is substantially similar to the shaping system 100 illustrated in FIG. 1 in which the position and configuration of some of the optical components are illustrated. Some of the elements of the nanoimprint lithography system 400 are not illustrated in order to clarify the arrangement of the optical components. The order, arrangement, and use of optical components such as light sources, apertures, beam splitters, lenses, and mirrors as illustrated in FIG. 4A are exemplary and other arrangements of optical components can be used to carry out an embodiment.

The shaping system 400 may include a first source of actinic radiation 426a and/or a second source of actinic radiation 426b. The first source of actinic radiation 426a may include a light emitter 450 which may be a laser, LED, or a lamp. The light emitter 450 is positioned to illuminate a SLM 448. One or more optical components may be arranged to guide the actinic radiation to the SLM 448. The light emitter 450 may receive one or more signals from the processor 140 with instructions on when and how much actinic radiation to provide.

The SLM 448 may be a digital micromirror device (DMD), Liquid Crystal on Silicon (LCoS), Liquid Crystal Device (LCD), spatial light valve, mirror array, MOEMS, diffractive MEMS, etc., which modulate the spatio-temporal distribution of actinic radiation from the light emitter 450. The shaping system 400 may include one or more optical components which guide actinic radiation from the SLM 448 through the shaping surface 112 and into the formable material 124 between the shaping surface 112 and the substrate surface 130.

The shaping system 400 may include a first beam combiner 452a which combines thermal radiation from a thermal radiation emitter 134 with actinic radiation from the light emitter 450. The first beam combiner 452a combines thermal radiation and actinic radiation into a single combined light source which is then guided towards the spatial light first modulator 448. In an embodiment, the SLM 448 is time multiplexed such that it may be used to provide a thermal radiation pattern for a first period of time and a first actinic radiation pattern for a second period of time. Examples of a system or a device which may be used as the first beam combiner 452a is: a dichroic beam combiner; a prism; a polarization beam combiner; a partially silvered mirror; an optical switch; an optical coupler; a fiber optical coupler; one or more optical components which can be used to guide both thermal energy and actinic energy towards the SLM 448; etc.

An embodiment, may include a second source of actinic radiation 426b which is not modulated by the SLM 448 and is guided to the plane of the formable material 124. Actinic radiation from the second source of actinic radiation 426b is guided by one or more optical components to the formable material 124. The second source of actinic radiation 426b may have the same or different wavelength from the first source of actinic radiation 426a. An embodiment may include a second beam combiner 452b which combines light from the first actinic radiation source 426a and the second source of actinic radiation 426b. Examples of a system or device which may be used as the second beam combiner 452b is: a dichroic beam combiner; a prism; a polarization beam combiner; a partially silvered mirror; a free space optical switch; one or more optical components which can be used to guide an optical images from both the first source of actinic radiation 426a and the second source of actinic radiation 426b towards the substrate 102; etc. In an embodiment, actinic radiation from each of the radiation sources may be directed at the formable material 124 from a different angle.

An embodiment, may include a field camera 136 which monitors the formable material 124 under the template 108 and may control the timing of the illumination of the formable material 124 with actinic radiation. An embodiment may include a third beam splitter/combiner 452c which may be used to combine gathered light that is to be used by the field camera with any of the beams of actinic radiation which are directed towards the formable material 124 under the shaping surface 112. Examples of a system or a device which may be used as the third beam splitter/combiner 452c is: a prism; a partially silvered mirror; a dichroic filter; a free space optical circulator, a free space optical switch; one or more optical components which can be used to guide an image from the substrate 102 and guide actinic radiation towards the substrate 102; etc.

As illustrated in FIG. 4A the SLM 448 may be a DMD. The DMD may include individual mirrors (modulation elements) on the SLM 448 that may be in a first state that guides light towards the shaping surface 112 or in a second state that guides the light away from the shaping surface 112 for example towards a beam dump 454.

The SLM 448 include a plurality of modulation elements that are tiled across the SLM 448. Each modulation element may be individually addressable in both space and time. The processor 140 may be configured to send sets of signals to the SLM 448 based on a map of modulation values received from the memory 142. In response to the first set of signals the SLM 448 will change the state of individual modulation elements in the SLM. In an embodiment, the map of modulation values is information indicating on/off status of each modulation element of the SLM 448 (DMD, LCD, LCoS). In an embodiment, the map of modulation is information indicating the status of each modulation element of the SLM 448 (DMD, LCD, LCoS). The status associated with each modulation element includes one or more of: on/off status; amount reflected (for reflective LCD); amount transmitted (for transmitted LCD); and on/off state duration.

In the case in which the SLM is a DMD changing the state of a modulation element means moving a micromirror from a first angle to a second angle. In the case in which the SLM 448 is a transmissive SLM, such as an LCD or a spatial light valve, changing the state of a modulation element means changing the transmissivity of the modulation element. Changing the transmissivity may include changing the state of a polarization retarder (for example a liquid crystal). The polarization retarder may include or be optically coupled to a polarizer which blocks some portion of the light. In the case in which the SLM 448 is a reflective SLM, such as an LCoS, changing the state of a modulation element means changing the reflectivity of the modulation element. Changing the reflectivity may include changing the state of a polarization retarder (for example a liquid crystal) on a reflective surface. The polarization retarder may include or be optically coupled to a polarizer which blocks some portion of the light.

In an embodiment, the second source of actinic radiation 426b is configured to illuminate a central portion of the shaping surface 112 and the first source of actinic radiation 426a is configured to illuminate the outer edges of the shaping surface 112 near the mesa sidewalls 246.

The shaping system 400 may include a projection system 456 which guides, focuses, and resizes light from first source of actinic radiation 426a and/or second source of actinic radiation 426b. The projection system 456 may include one or more: lenses; apertures; mirrors, prisms, beam combiners, windows, etc. For example, a first portion of the projection system 456 may include a first lens 458a and a second lens 458b which guides and expands light from the second actinic radiation source 426b to the formable material 124. The first portion of the projection system 456 may also gather light from the formable material 124 and guide it to the field camera 136. A second portion of the projection system 456 may include the first lens 458a and a third lens 458c. The second portion of the projection system 456 which guides actinic radiation from the SLM 448 to the formable material 124.

Figure 4B:
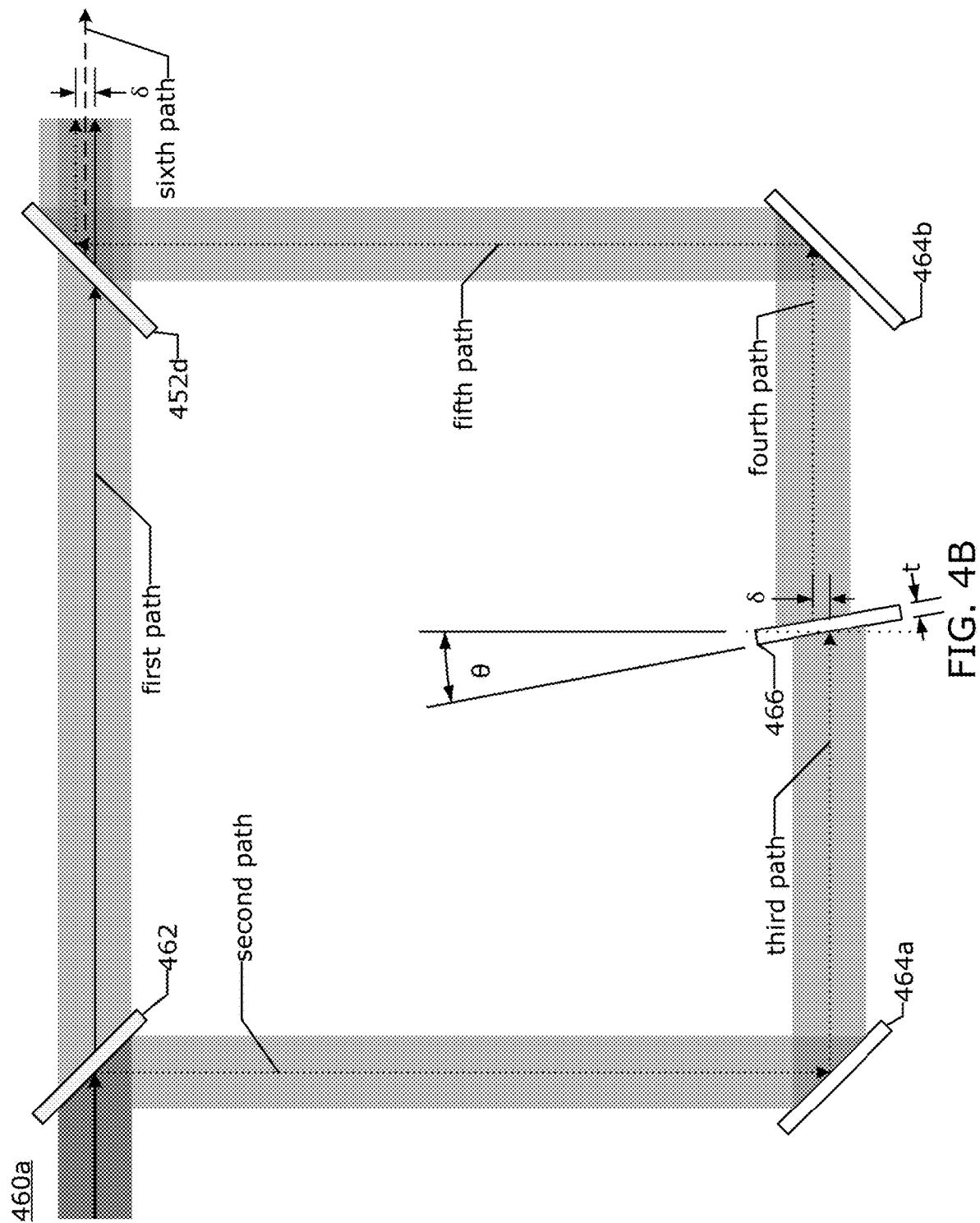

The first source of actinic radiation 426a includes a first set of optical components 460a which is configured to receive actinic radiation from the SLM and emit a combined image. Details of an exemplary embodiment of the first set of optical components 460a are illustrated in FIG. 4B. In which the combined image includes a first image of the SLM and a second image of the SLM that is offset in a direction orthogonal to the optical axis compared to the first image. The first set of optical components 460a may include a beam splitter 462. The beam splitter 462 may receive an image of the SLM and emits a first image of the SLM along a first path and second image of the SLM along a second path that is different from the first path. The shaping system 400 may include one or more optical components such as mirrors, lenses, apertures, polarizer, faraday rotator, etc. between the light emitter 450 and the beam splitter 462 such that beam divergence, magnification, and focus are well controlled when received by the beam splitter 462. Examples of a system or a device which may be used as the beam splitter 462 is: a cube beam splitter; a plate beam splitter; a polarizing beam splitter; a non-polarizing beam splitter; a half-silvered mirror; a wire grid beam splitter; a surface of an optical glass block; one or more optical components which can receive an image of the SLM and form the first image of the SLM and the second image of the SLM; etc.

In an embodiment, the beam splitter 462 receives both thermal radiation and actinic radiation. The actinic radiation may have a shorter wavelength than the thermal radiation. The applicant has determined that one performance characteristic of the beam splitter 462 which is important is the ratio of the intensity of radiation in each image emitted by the beam splitter 462 divided by the intensity of radiation received by the beam splitter. This ratio has a wavelength dependence. The applicant has found that performance of the shaping system 100 is improved if the beam splitter 462 has a ratio which is higher for thermal radiation than for actinic radiation for one of the images emitted by the beam splitter 462. The ratio for thermal radiation should be at least 30% greater than the ratio for actinic radiation. For example, the for the actinic radiation may be 50% while the ratio for thermal radiation is greater than 80%. In an alternative embodiment, the shaping system may include a thermal radiation filter in which thermal radiation is redirected or absorbed along one of the optical paths between the beam splitter 462 and the fourth beam combiner 452d but not along the other optical path.

In an embodiment, the first image of the SLM is guided from the beam splitter 462 towards a fourth beam combiner 452d. Examples of a system or a device which may be used as the fourth beam combiner 452d is: a prism; a polarization beam combiner; a partially silvered mirror; a surface of the optical glass block used for the beam splitter 462; one or more optical components which can be used to form the combined image from the first image of the SLM and the second image of the SLM; etc.

In an embodiment, the second image of the SLM is guided from the beam splitter 462 towards a first mirror 464a. The first mirror 464a redirects the second image of the SLM from the second path to a third path. In an embodiment, the third path may be orthogonal to the second path which may make construction and alignment of the optical system simpler. In an alternative embodiment, the third path is not orthogonal to the second path which may allow the system to be smaller. Examples of a system or a device which may be used as the mirror 464a is: a front surface mirror, a plate coated with a metallic mirror coating; a Bragg reflector; a plate coated with multiple dielectric layers; a prism; a surface of the optical glass block used for the beam splitter 462; one or more optical components which can be used to fold the path of the second image of the SLM and send it in a new direction along a new path; etc.

Figure 4C:
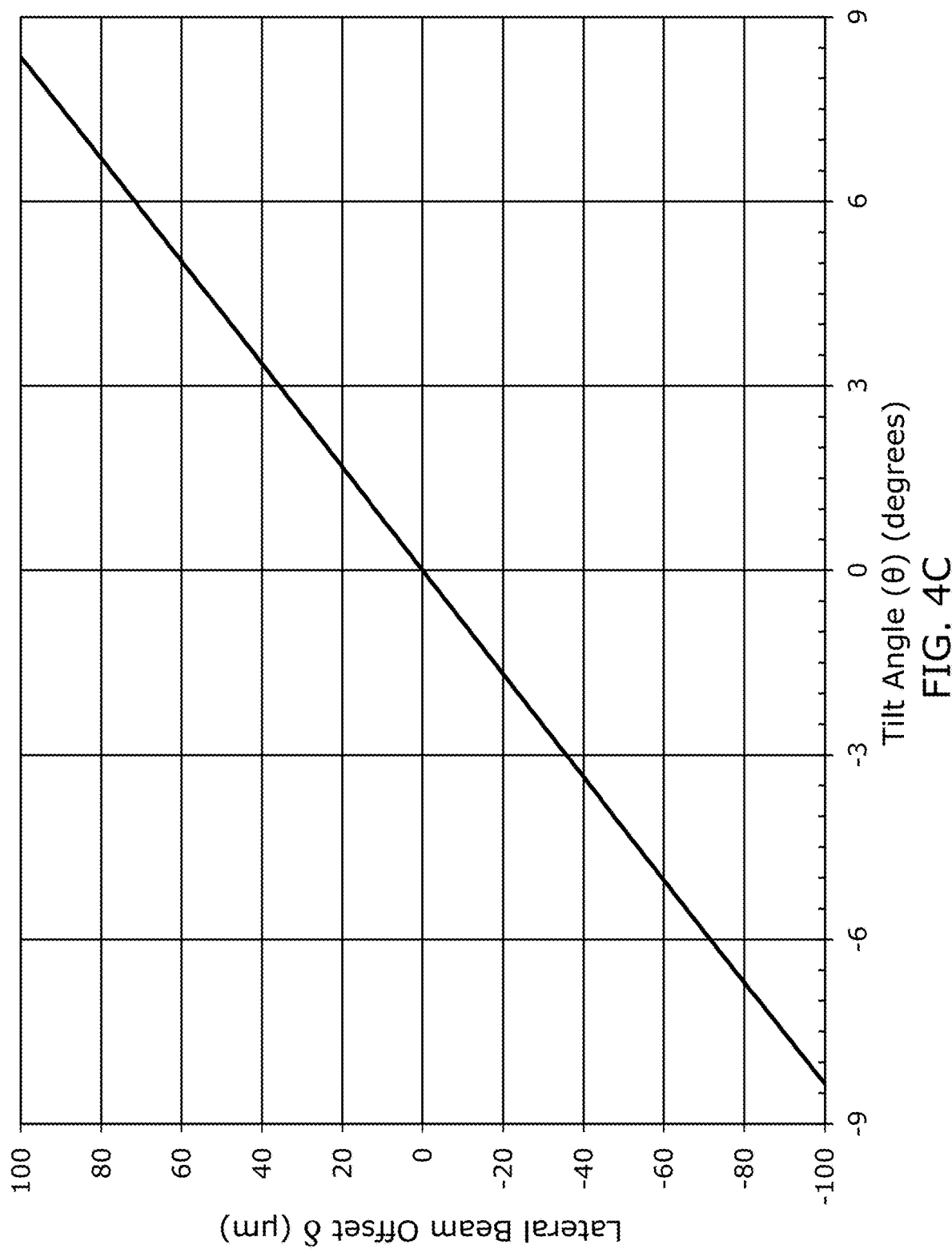
FIG. 4C is a plot illustrating a relationship between lateral beam offset and tilt angle of a component in an exemplary nanoimprint lithography system as used in an embodiment.

In an embodiment, the second image of the SLM that is traveling along a third path may pass through a tilted glass plate 466. A surface of the tilted glass plate 466 is tilted at an angle θ relative to a plane that is orthogonal to the third path of the second image of the SLM as it intersects with the tilted glass plate 466. The tilted glass plate 466 causes a lateral beam displacement δ as described equation (1) below. In which n is the refractive index of the tilted glass plate 466 and the t is the thickness of the tilted glass plate 466. FIG. 4C is a plot showing the dependence of the lateral beam displacement δ with the angle θ with a refractive index n of 1.516 and a thickness of 2 mm. The second image of the SLM exits the tilted glass plate 466 along a fourth path that is parallel to and offset from the third path.

$$\delta = t\sin\theta\left(1 - \frac{\cos\theta}{\sqrt{n^2 - \sin^2\theta}}\right) \quad (1)$$

In an embodiment, the second image of the SLM that is traveling along a fourth path and is guided from the tilted glass plate 466 towards a second mirror 464b. The second mirror 464b redirects the second image of the SLM from the fourth path to a fifth path. In an embodiment, the fifth path may be orthogonal to the fourth path (as shown in FIG. 4B) which may make construction and alignment of the optical system simpler. In an alternative embodiment, the fifth path is not orthogonal to the fourth path which may allow the system to be smaller. Examples of a system or a device which may be used as the second mirror 464b are: a front surface mirror, a plate coated with a metallic mirror coating; a Bragg reflector; a plate coated with multiple dielectric layers; a prism; a surface of the optical glass block used for the beam splitter 462; one or more optical components which can be used to fold the path of the second image of the SLM and send it in a new direction along a new path; etc.

In an embodiment, the second image of the SLM that is traveling along a fifth path and is guided from the second mirror 464b towards the fourth beam combiner 452d. The fourth beam combiner 452d receives both: the first image of the SLM that has traveled along the first path; and the second image of the SLM that has traveled along the fifth path. A combined image exits the fourth beam combiner 45 along a sixth path. The combined image is a combination of a: first image of the SLM; and a second image of the SLM offset in a direction orthogonal to the optical axis compared to the first image of the SLM. In an embodiment, the offset distance is the lateral beam displacement δ produced by the tilted glass plate 466. In an embodiment, the offset distance is a function of the lateral beam displacement δ produced by the tilted glass plate 466. In an embodiment, the offset distance is a linear function of the lateral beam displacement δ produced by the tilted glass plate 466. In an embodiment, the offset distance is determined by the relative positions of two or more of: the beam combiner 452d; the first mirror 464a; the second mirror 464b; and the tilted glass plate 466. The location of the tilted glass plate 466 between the first mirror 464a and the second mirror 464b is exemplary. The tilted glass plate 466 should be located between the beam splitter 462 and the beam combiner 452d. The tilted glass plate 466 may include an aperture.

First Alternative Embodiment

Figure 4D:
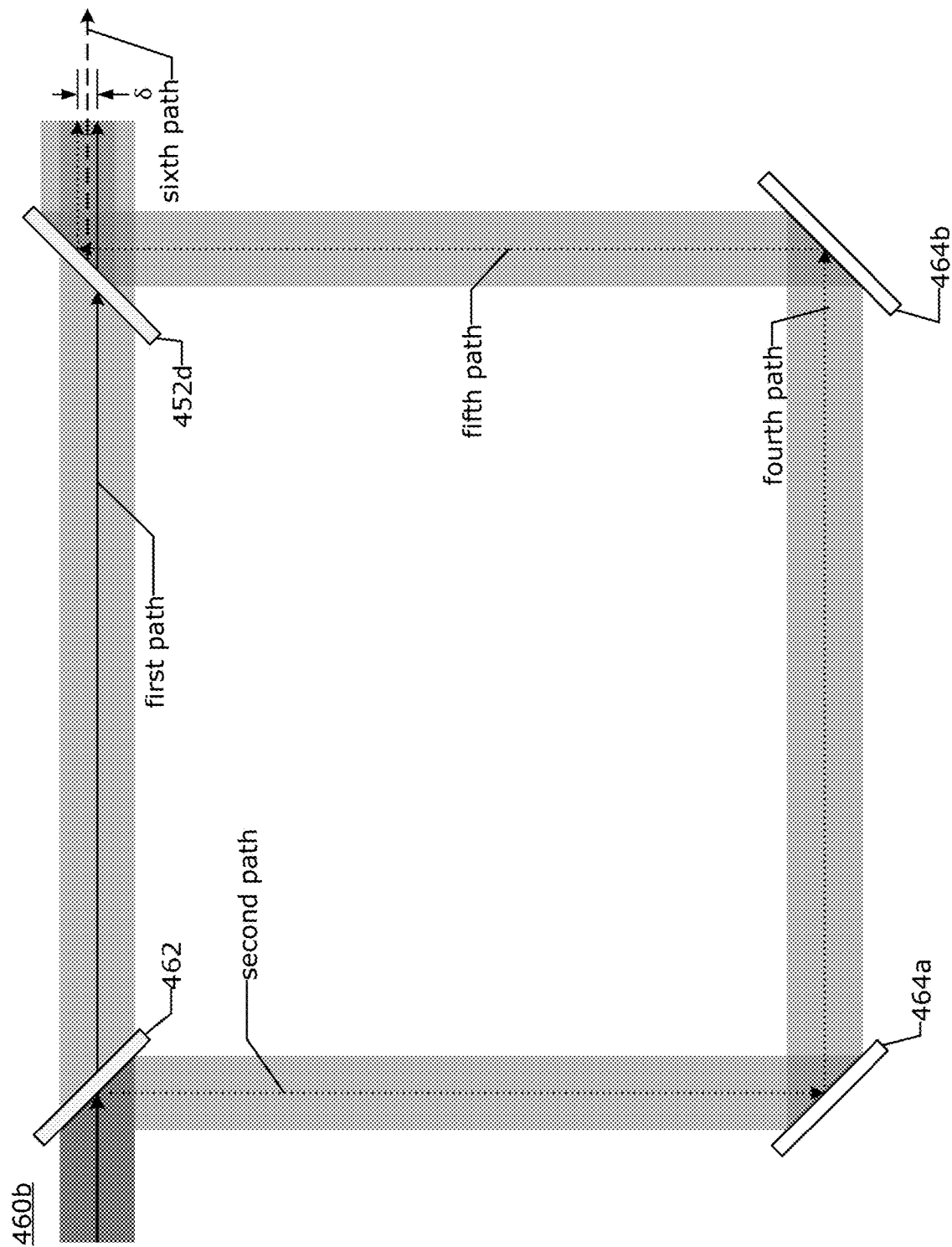

Details of an alternative exemplary embodiment of the set of optical components 460b are illustrated in FIG. 4D. The alternative set of optical components 460b are substantially similar to the first set of optical components 460a except that it does not include the tilted glass plate 466. Instead, the second beam combiner 452b, the beam splitter 462, the first mirror 464a, and the second mirror 464b are all arranged relative to each other such that there is a controlled lateral beam displacement δ between the first image of the SLM and the second image of the SLM as they exit the beam combiner 452d. The alternative set of optical components 460b is simpler and more stable than the first set of optical components 460a. An advantage of the first set of optical components 460a over the alternative set of optical components 460b is the ease of adjusting lateral beam displacement δ which makes building, aligning, adjusting, and maintaining the alignment of the lateral beam displacement δ more efficient, accurate, and adjustable over time.

Second Alternative Embodiment

Figure 4E:
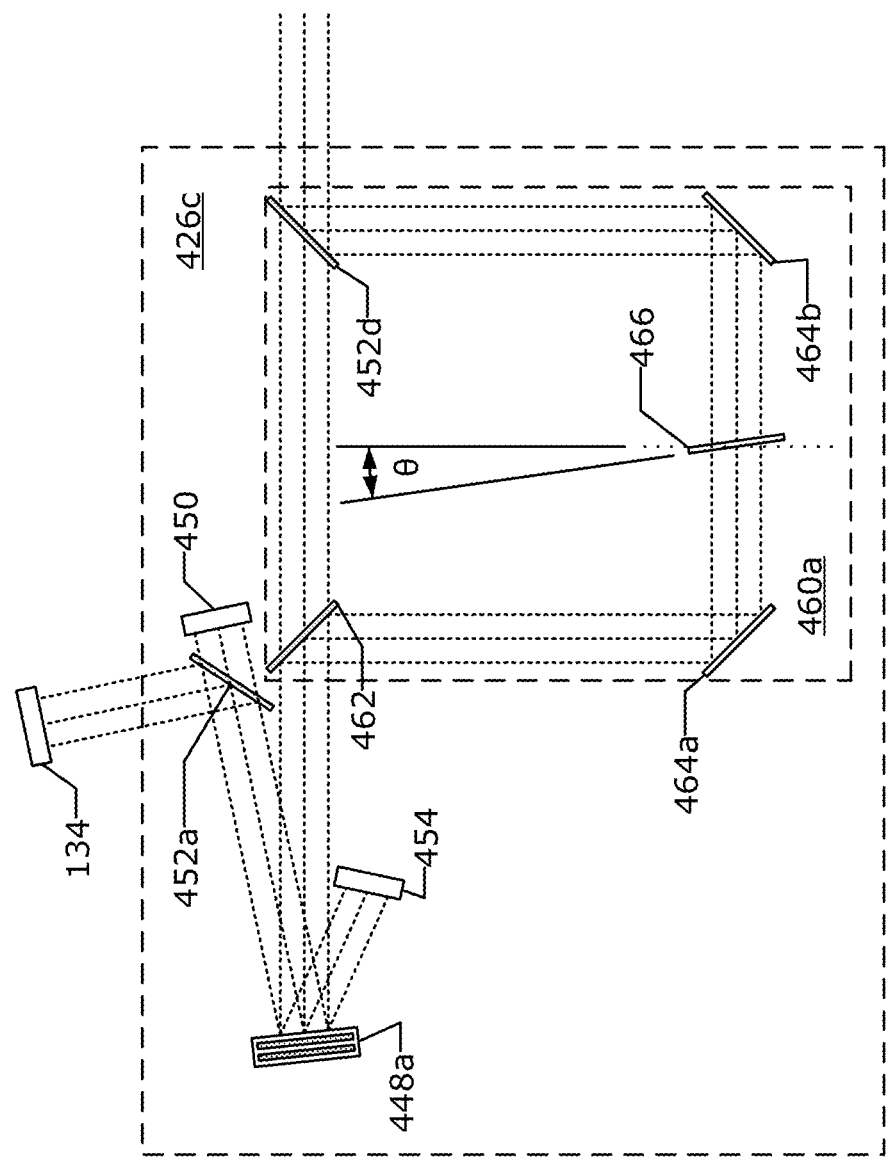
Figure 4F:
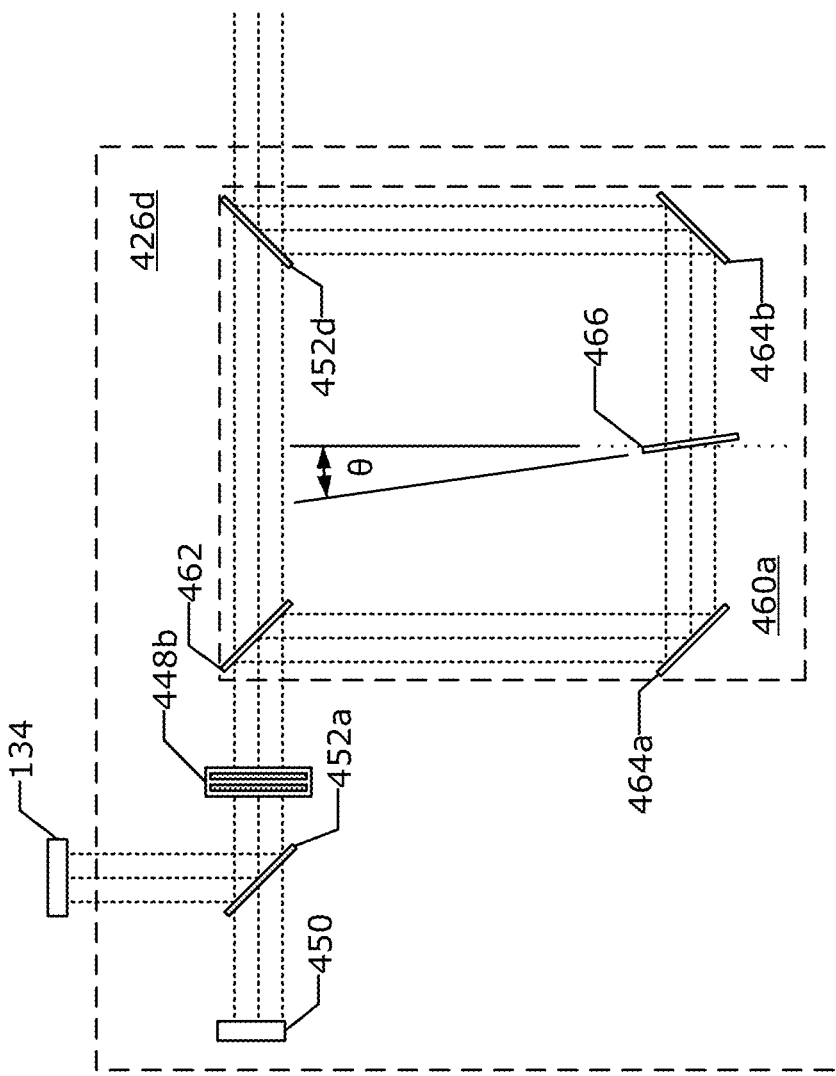
Figure 4G:
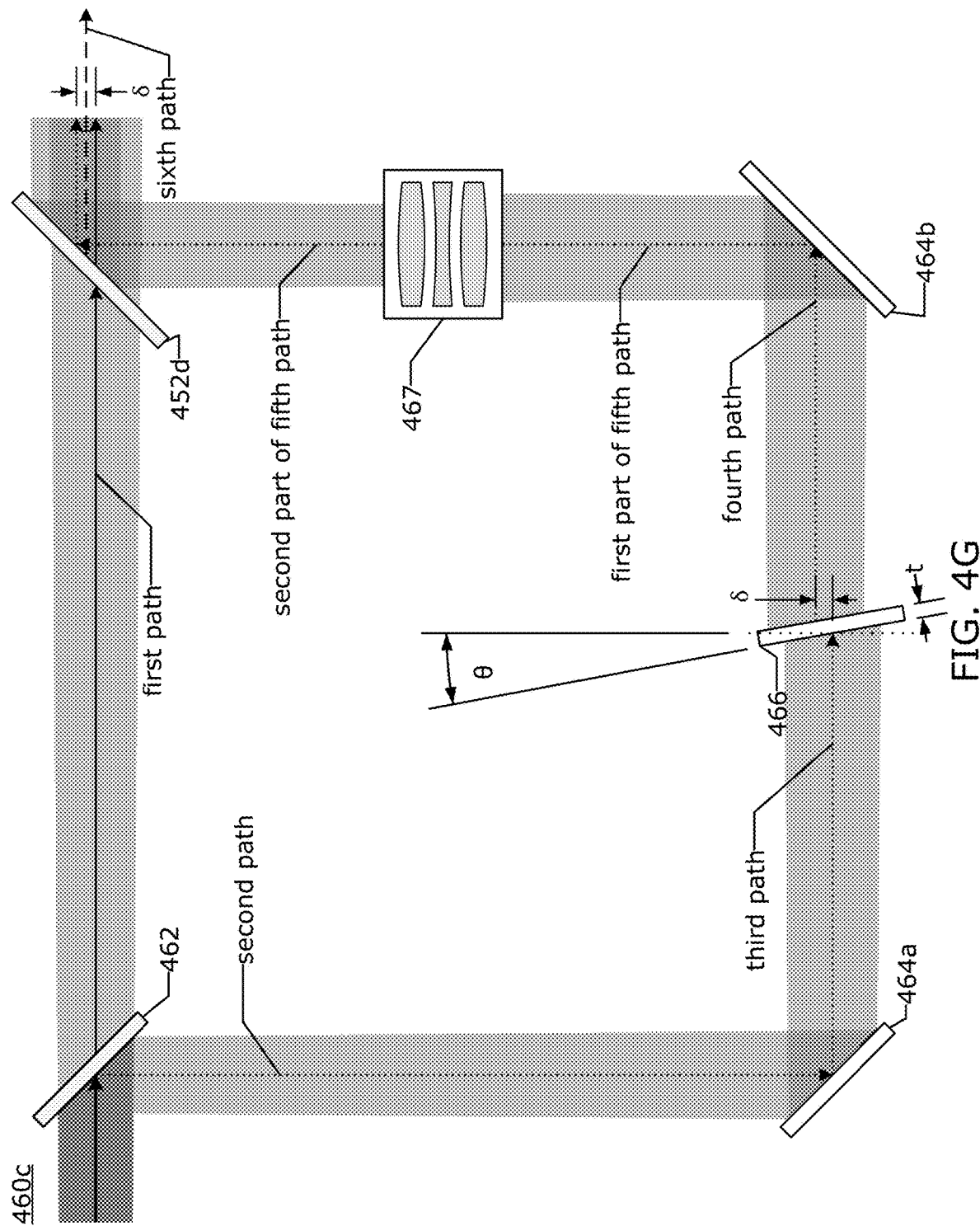

Details of a second alternative exemplary embodiment of the set of optical components 460c are illustrated in FIG. 4G. The second alternative set of optical components 460c are substantially similar to the first set of optical components 460a except that includes a lens assembly 467 in one of the optical paths between the beam splitter 462 and the beam combiner 452d. A second alternative exemplary embodiment may include additional optical components (for example lenses, curved mirrors, apertures, etc.) in one or more of the optical paths (first path, second path, third path, fourth path, and fifth path) which adjust the relative sizes of one or both of the first image of the SLM relative to the second image of the SLM. The second alternative exemplary embodiment, is substantially similar to the shaping system 400 except that it may include a lens assembly 467 as illustrated in FIG. 4G in which a third set of optical components 460c is used as a replacement for the first set of optical components 460a. FIG. 4G illustrates an exemplary embodiment of optical in which actinic radiation in the image of the SLM received by the beam splitter 462 has a beam divergence of 1°. In the example illustrated in FIG. 4G, the lens assembly 467 is placed into the fifth path between the second mirror 464b and the fourth beam combiner 452d. The lens assembly 467 may be configured to adjust both the divergence and the beam diameter such that size of images of modulation elements in the first image of the SLM at the plane of the formable material is the same as the size of images of modulation elements in the first image of the SLM. In an embodiment, includes one or more: holographic optical elements, lenses, mirrors, and apertures.

The lens assembly 467 may be configured to ensure that a first set of optical properties of the first image at the plane of the formable material are different from a second set optical properties of the second image at the plane of the formable material. For example, the first set of the optical properties may include a first average distance of the focal plane of the first image from a plane of the formable material. For example, the second set of the optical properties may include a second average distance of the focal plane of the first image from the plane of the formable material. The first average distance may be greater than the second average distance, in which case the first image is less focused the second image. The first set of optical properties may also include a first size of the first image at the plane of the formable material. The second set of optical properties may also include a second size of the second image at the plane of the formable material. The first size of the first image is less than a second size of the second image. Such that at the plane of the formable material the first image of the SLM is smaller and less focused than the second image of the SLM. In an embodiment, an aperture placed along one of the paths between the beam splitter 462 and the fourth beam combiner 452d may be used to control the size of first image relative to the size of the second image. The aperture may be configured to be configured to block one or more rows and columns of images of modulation elements that are turned on in the first SLM along some edge of the image. In an embodiment, the shape of the aperture may match the shape of the mesa. In an embodiment, the first image of the SLM may be smaller and less focused then second image of the SLM, while pitches between images of modulation elements in the first and second images of the SLM are within 3% of each other or substantially the same. The first image of the SLM may be smaller, less focused and inset within the second image of the SLM at the plane of the formable material. The aperture may include a plurality of adjustable blades.

In an embodiment, without the additional optical components a first size of the first image of the SLM exiting the beam combiner will be different from a second size of the second image of the SLM exiting the beam combiner. The additional optical components can be placed in the first path to adjust the size of the first image of the SLM relative to the second image of the spatial light such that the size are equal when they reach the substrate surface 130. The additional optical components can be placed in the second, third, fourth, or fifth path to adjust the sizes of images the modulation elements in the second image of the SLM relative to sizes of images the modulation elements in the first image of the SLM such that the sizes of images the modulation elements are equal when they reach the substrate surface 130.

The additional optical components can also be used to adjust the focal plane of the first image of the SLM relative to the focal plane of the second image of the SLM. In an embodiment, both focal planes of the first and second images of the SLM are between shaping surface 112 and substrate surface 130. In an embodiment, only one of the focal planes of the first and second images of the SLM are between shaping surface 112 and substrate surface 130.

In an embodiment, the additional set of optical components is configured to control a first average size of a first set of projected images of the modulation elements of the SLM 448 at a plane of the formable material. In an embodiment, an average size of images of each modulation element in the first image of the SLM at the plane of the formable material are configured to be greater than a second average size of images of each modulation element in the second image of the SLM at the plane of the formable material. In an embodiment, the additional set of optical components is configured to control the relative sizes of the projected images of the modulation elements at the plane of the formable material to have different sizes.

In an embodiment, the additional set of optical components is configured to control the relative projected pitches of the projected images of the modulation elements at the plane of the formable material to have identical projected pitches of the projected images of the modulation elements. In an embodiment, the additional set of optical components are configured to control both the relative sizes of the projected images of the modulation elements to be different in size while controlling the projected pitches of the projected images to be the same.

In an embodiment, the additional set of optical components are configured to control locations of an image plane for each modulation element of each image of the SLM. In an embodiment, the image plane for each modulation element is not at the same location due to distortions in the optical system. There is an average image plane associated with each image of the SLM that is averaged over the modulation elements. In an embodiment, the additional set of optical components are configured to control an average location of a first image plane of the first image of the SLM to have a first distance from the plane of the formable material. In an embodiment, the additional set of optical components are configured to control a location of a second image plane of the second image of the SLM to have a second distance from the plane of the formable material. In an embodiment, the first distance is different from the second distance. In an embodiment, an image plane difference between the first distance and the second distance is greater than 5 mm.

In an embodiment, the additional set of optical components are configured such that the differences in the projected pitches is less than a threshold while the image plane difference is greater than a second threshold.

LCOS SLM

FIG. 4E is an illustration of an alternative embodiment of the first source of actinic radiation is replaced with an alternative first source of actinic radiation 426c in which the SLM 448 is a reflective spatial intensity modulator 448a such as a LCoS device. The reflective SLM 448a may include a spatio-temporally addressable liquid crystal polarization retarder, a polarizer, and a reflective surface such as silicon. The reflective SLM 448a may include a MEMS based spatio-temporally addressable reflective surface.

LCD SLM

FIG. 4F is an illustration of an alternative embodiment of the first source of actinic radiation is replaced with a second alternative first source of actinic radiation 426c in which the SLM 448 is a transmissive SLM 448b such as LCDs. The transmissive SLM 448b may include a spatio-temporally addressable liquid crystal polarization retarder and a polarizer. The transmissive SLM 448b may include MEMS based spatio-temporally addressable light valves.

Additional Components

The SLM 448 is positioned to illuminate the formable material 124 under the template 108 with a spatio-temporal distribution of energy ($J/m^2$) in accordance with signals received from the processor 140 which are representative of a map of modulation values (for e.g. intensity & duty cycles). The actinic radiation cures or helps cure the formable material 124 under the template 108. An embodiment may include optical components such as lenses, mirror, apertures, etc. which guide the radiation from the SLM 448 to the formable material 124. An embodiment may include optical components which help match the shape of the active area of the SLM 448 to the shape of the mesa 110. An embodiment may include optical components which adjust the position of the focal plane of the actinic radiation from the SLM relative to formable material 124.

In an embodiment, the optical components including components of the projection system 456 may expand the combined image by a factor of: 5×; 4.8×; 4.6×; 4.4×; 4.2×; 4.4×; 4.2×; 4.0×; 3.0×; 2.5×; 2×; 1.5×; etc. In an embodiment, the additional set of optical components match the field of the modulation elements of the SLM with the approximate size of the shaping surface 112. For example, the field of the modulation elements for a DMD type SLM may be 14.0×10.5, 19.3×12.1, 20.7×11.6 mm and the imprint field may be 26×33 mm requiring that the magnification be greater than 2 or more. An LCD type SLM may be larger than the imprint field requiring that the one or more of the optical components shrinks the image produced by the SLM by a factor of: 0.8×; 0.5×; 0.1×; etc.

In an embodiment, one or both the first and second images of the SLM are focused at the plane of the formable material. In an embodiment, the first image of the SLM is expanded by a first magnification factor and the second image of the SLM is expanded by a second different magnification factor.

In an embodiment, the first set of optical components has a first optical distance between the beam splitter 462 and the fourth beam combiner 452d. In an embodiment, the first set of optical components has a second optical distance between the beam splitter 462 and the fourth beam combiner 452d that is different from the first optical distance and takes a different path than the path that has the first optical distance. In an embodiment, an optical path difference between the first optical distance and the second optical path is used to control a difference between the focal planes of the first and second images of the SLM at the plane of the formable material. In an embodiment, the optical path difference between the first optical distance and the second optical path is used to control a difference between magnifications of the first and second images of the SLM at the plane of the formable material. In an embodiment, the optical path difference between the first optical distance and the second optical path is used to control a difference between shapes of images of modulation elements in the first and second images of the SLM at the plane of the formable material.

Third Alternative Embodiment

A third alternative embodiment, may include additional beam splitters and beam combiners which allow additional images of the SLM, each with their own properties, to be added to the combined image which is then projected onto the plane of the formable material. Examples of properties include: the lateral beam offset relative to the first image of the SLM; average intensity of each image of the SLM; magnification of each image of the SLM; and focal plane location of each image of the SLM.

SLM

In an embodiment, the fill factor of the SLM 448 is less than 100%. The fill factor of SLM can vary significantly depending on the modulation technology used by the SLM and are typically found to be in the 70-99% range. The applicant has found that artifacts can be formed in the cured formable material due to an SLM with a less than 100% fill factor. The applicant has found that the impact of these artifacts can be mitigated by forming a combined image including a first image of the SLM and a second image of the SLM that is offset from the first SLM.

Figure 5A:
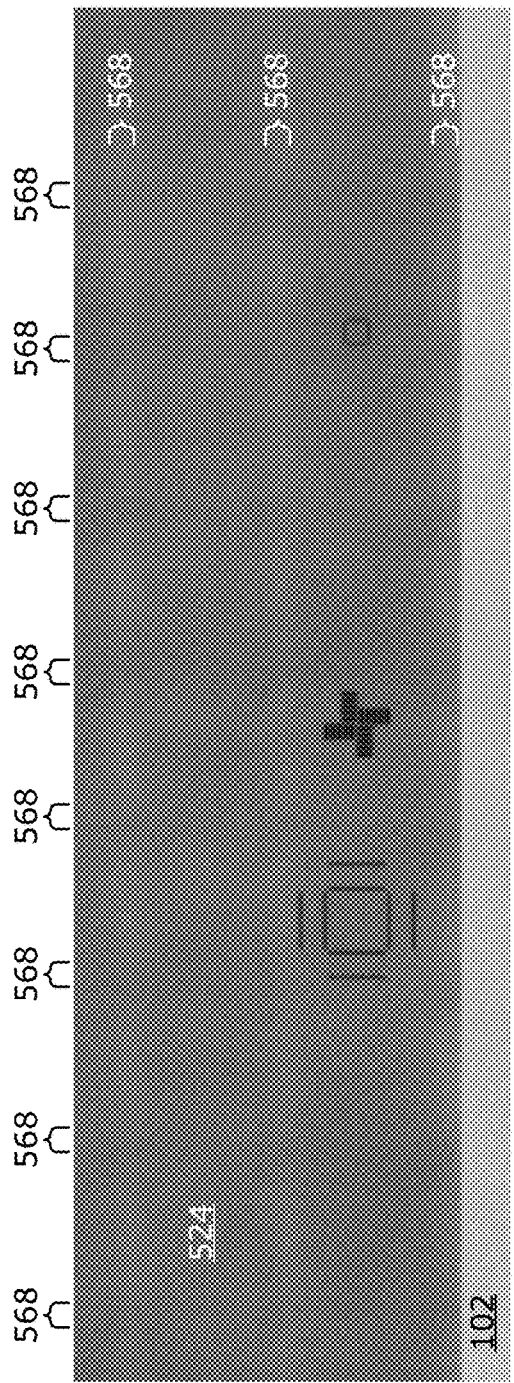
FIG. 5A is a micrograph illustrating a cured film as produced by nanoimprint lithography system with a single spatial light modulator.

FIG. 5A is a micrograph of a cured film 524 on a substrate 102. The cured film 524 includes three features shown as black areas of the micrograph. The cured film 524 includes undercured regions in interstitial areas 568. These undercured regions can impact the ability to inspect and identify defects. Sometimes these undercured regions can also impact the ability to transfer patterns into the substrate in subsequent processing steps S312.

When the additional set of optical components focus the modulation elements of the SLMs 448 onto the formable material 124 under the shaping surface 112 gaps between the modulation elements are revealed in the cured film 524 as grid lines (interstitial area 568) as illustrated in FIG. 5A. The interstitial area 568 has a lower intensity then the rest of the cured film. The interstitial area 568 has an RLT (produced by protrusions 116 in the template 108) and pillar (produced by recesses 114 in the template 108) height that has been reduced by 1-4 nm. These differences in curing of the cured film in the interstitial area 568 relative to the rest of the cured film 524 are evident by the variation in intensity of horizontal and vertical lines as illustrated in FIG. 5A. The contrast in the micrograph may be detected as a defect by an automated inspection tools even if the features in those areas are acceptable for pattern transfer process. The amount of "noise" that this causes for the fine feature inspection raises issues because actual defects of interest become more difficult to detect.

Figure 5B:
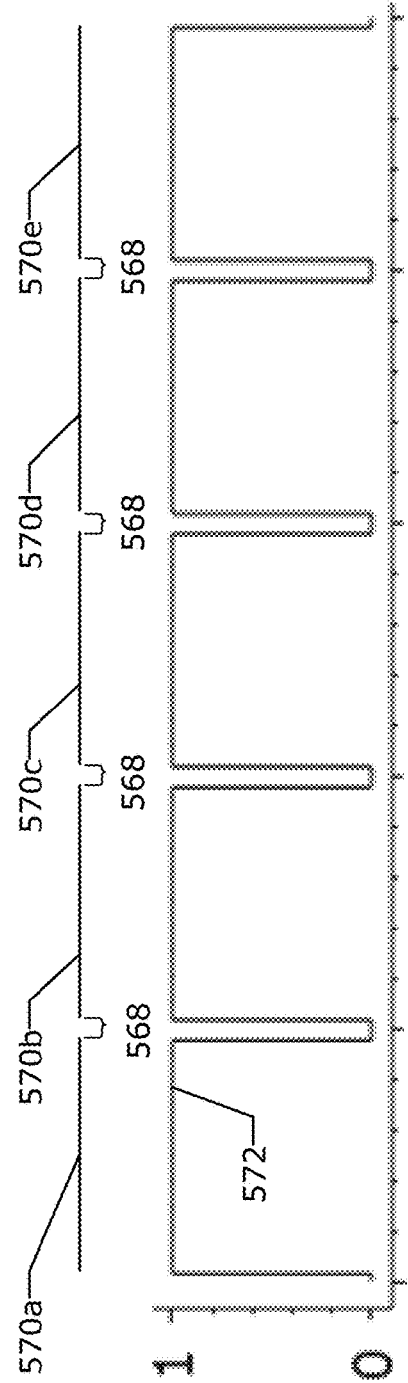
FIG. 5B is an illustration of modulation elements and an idealized spatial distribution of actinic radiation associated with the modulation elements used in embodiments.

FIG. 5B is an illustration of the active areas of 5 exemplary modulation elements (570a, 570b, 570c, 570d, and 570e) in a SLM with a 92% fill factor. In between each modulation element is an interstitial area 568. FIG. 5B also illustrates a cross section of an idealized actinic radiant intensity pattern 572 at the formable material 124 under the template 108, in the case where the five modulation elements 570a-e are turned on and perfectly focused at the plane of the formable material.

Figure 5C:
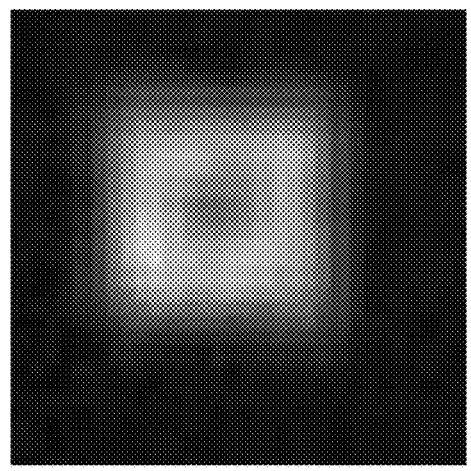
FIGS. 5C-H are information representing a measured spatial distribution of actinic radiation supplied by modulation elements as used in embodiments.
Figure 5D:
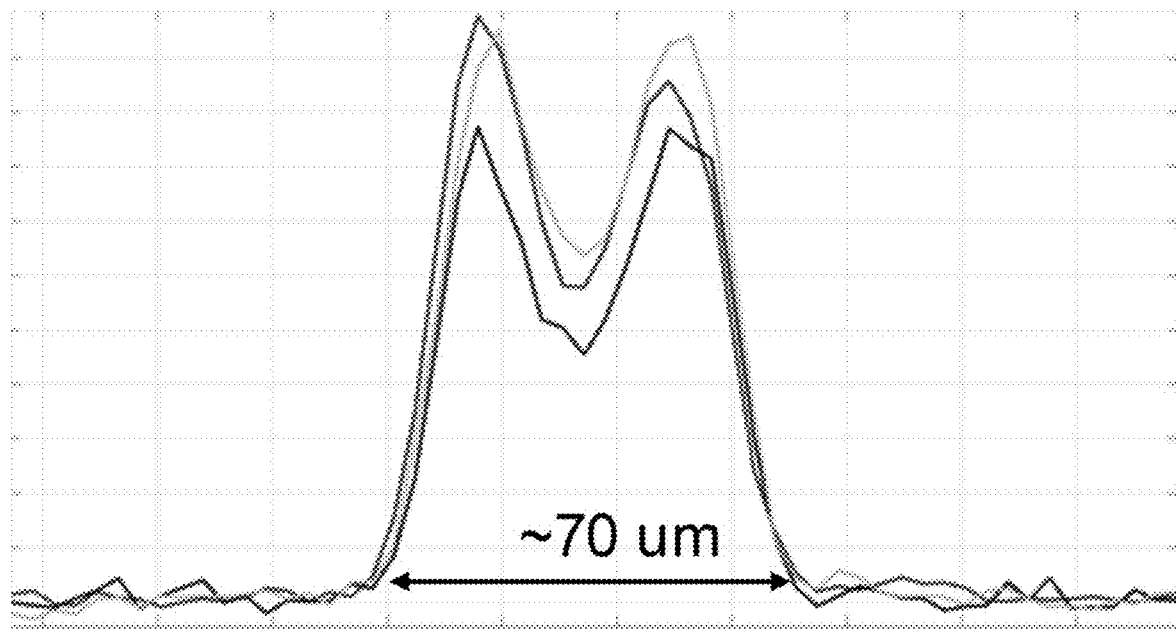

FIG. 5C is a measured intensity map of an irradiation pattern produced by a single beamlet of a single modulation element of a DMD type SLM 448 when it is focused at the plane of the formable material. FIG. 5D is a plot showing cross sections of the measured intensity data in the intensity map data shown in FIG. 5C. Note the grey center in the middle of the image is from the support post that provides the hinge on which the mirror associated with an individual modulation element of the DMD is pivoted.

Figure 5E:
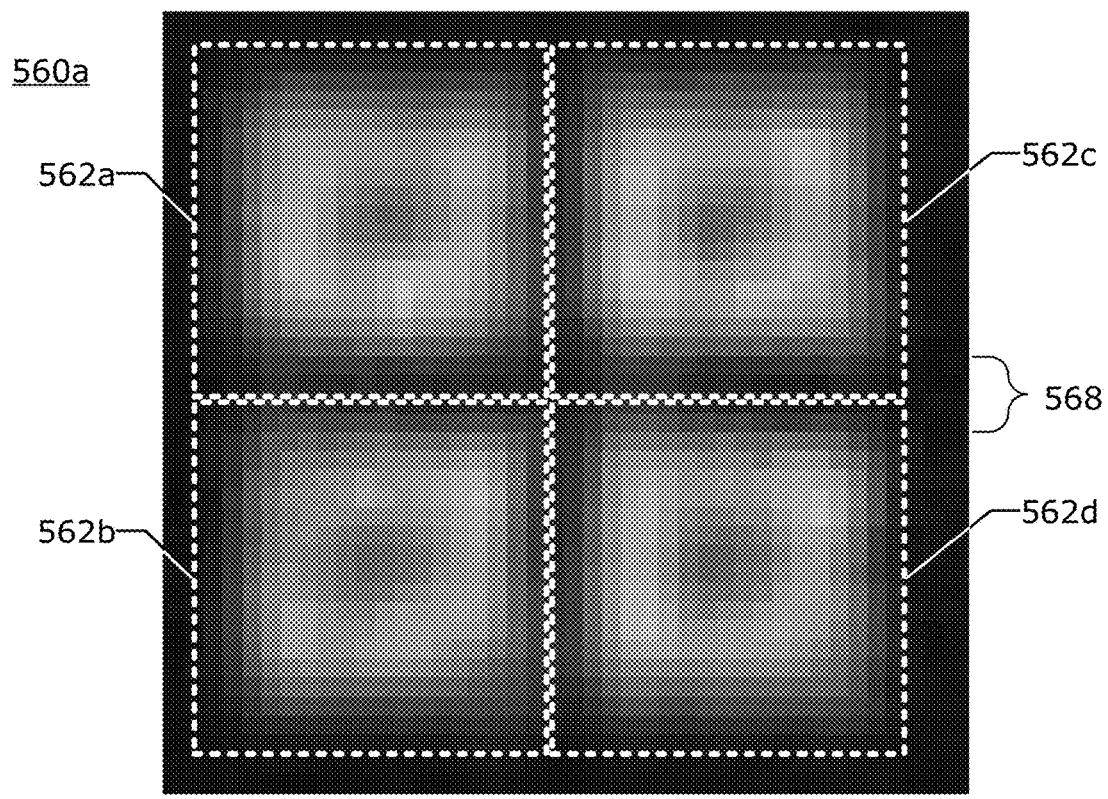
Figure 5F:
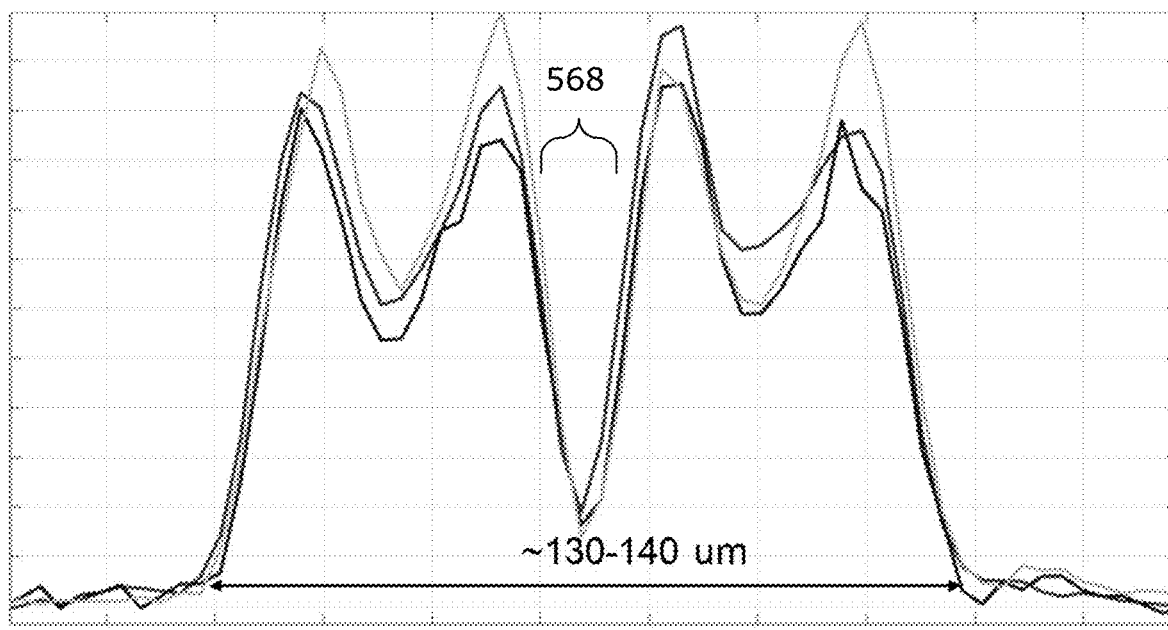

FIG. 5E is a measured intensity map of an irradiation pattern produced by four beamlets of four neighboring modulation elements of a DMD type SLM 448 when it is focused at the plane of the formable material. FIG. 5F is a plot showing cross sections of the measured intensity data in the intensity map data shown in FIG. 5E. Note the black cross between individual modulation elements in FIG. 5E showing the interstitial area 568.

Figure 5G:
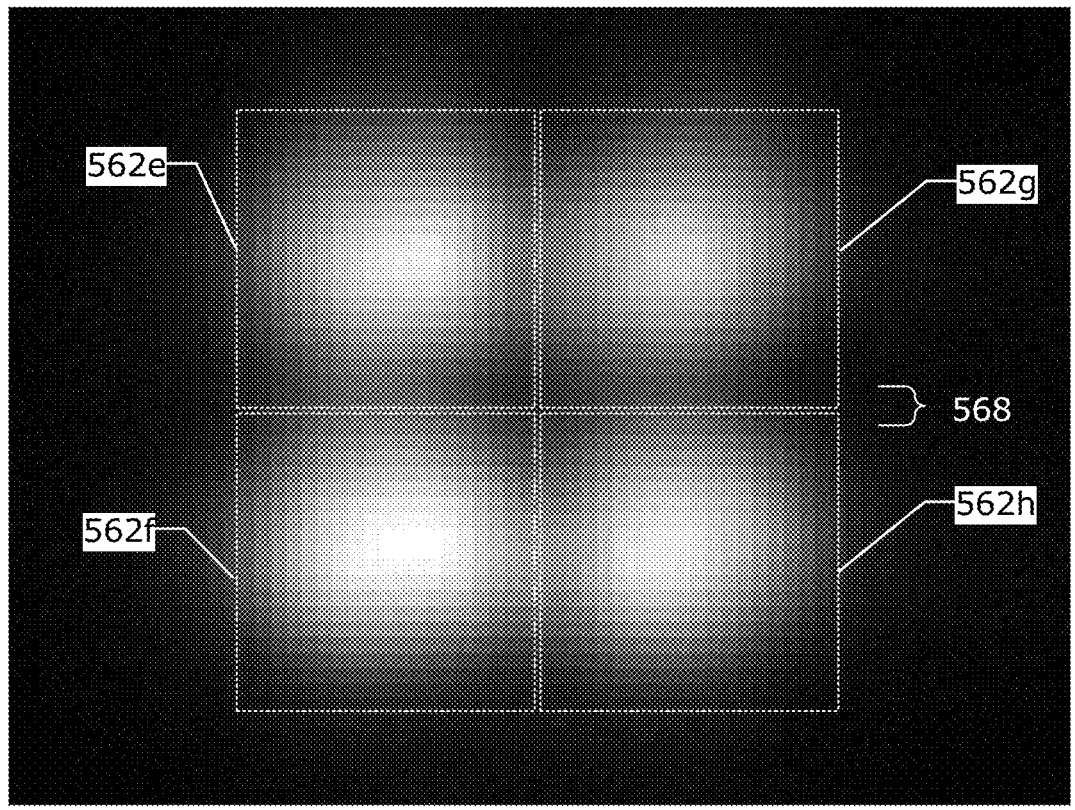
Figure 5H:
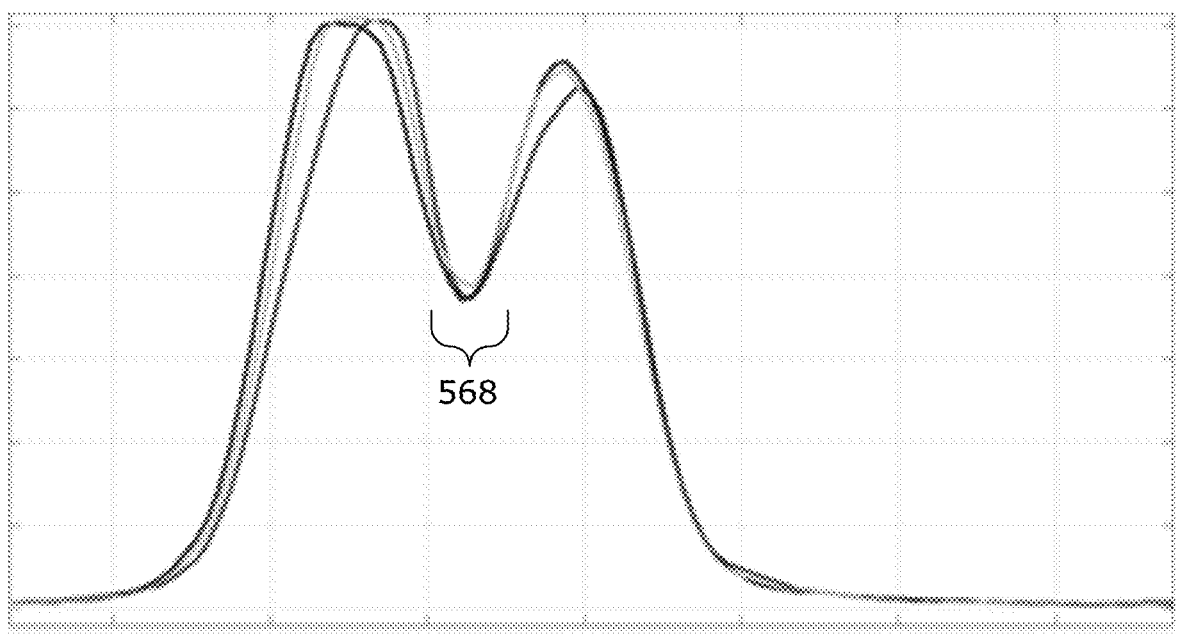

FIG. 5G is a measured intensity map of an irradiation pattern produced by those four beamlets of four neighboring modulation elements of a DMD type SLM 448 when it is defocused at the plane of the formable material. FIG. 5G is an example of a projected defocused pattern 560b made up of four projected defocused subpatterns 562e-h. FIG. 5H is a plot showing cross sections of the measured intensity data in the intensity map data shown in FIG. 5G. Note that when the irradiation pattern is defocused the grey center spot associated with each modulation element is not detectable. Also note that the intensity of the irradiation in the interstitial area 568 is increased. In addition, the rate at which the intensity of the defocused beam drops off from the peak decreases relative to a more focused beam shown in FIG. 5E. Thus, defocusing improves the uniformity of the irradiation but, also decreases the rate at which the intensity drops off from beamlets near the mesa sidewall 246, which reduces the ability to control the edges of the beamlet intensity profile precisely.

Modulation elements such as micromirrors in a DMD array of DMD type SLM may have a 0.3-1 µm gap between them (depending on the DMD device). These gaps (interstitial areas 568) between modulation elements allow the micromirrors to be rotated freely between two operational states (off/on) and a non-operational state (parked).

In an embodiment, optical components guide sets of beamlets of light that are reflected from the micromirror surface when it is in one of the operational states to the formable material 124 under the shaping surface 112 and blocks a substantial amount of light that is reflected and scattered from the gaps and micromirror surface when they are in the other operational state or parked.

Grid lines 568 between each modulation element are visible in the cured film 524 because the lower dose of actinic radiation at those locations results in less curing. This may result in the evaporation of features and reduction of RLT after separation of the template 108 from the cured film 524.

In an embodiment, in which an SLM image is magnified at the plane of the formable material, dead zones between the modulation elements are also magnified. Furthermore, diffraction of light can occur at edges of modulation element. The applicant has found that the intensity of actinic radiation in these interstitial areas 568 at the plane of the formable material is not zero but is reduced as illustrated in FIGS. 5E-H.

In an embodiment, the low intensity light between adjacent mirrors may be measured by an image sensor in the same plane as the formable material or through other means. Measuring the low intensity light in the interstitial regions may be used for calibrating compensation for this low intensity light.

The applicant has found that when the beamlets of actinic radiation is sufficiently defocused at the plane of the formable material the impact of the lower intensity of the actinic radiation in the interstitial area 568 is reduced. There is less shrinkage and the grid lines in the interstitial area 568 becomes less apparent when inspecting these images. The downside of defocusing is that there is less control of the actinic radiation at the edges of the formable material which impacts extrusion control (control of curing of formable material that leaks beyond the mesa edge).

Exposure time is one of the process steps that affect the throughput of the nanoimprint lithography system 100. It is beneficial to reduce exposure time to increase productivity of the tool. The minimum exposure time which can adequately cure the formable material 124 for acceptable defectivity or pattern transfer becomes limited and defined by those regions receiving the lower intensity in the interstitial area 524.

Formable material 124 which received the lowest dose compared to formable material 124 which received the highest dose may have different mechanical properties (modulus, elongation, etc.) which may result in either separation defects or defects during pattern transfer process (reactive ion etching etch rate differences, thickness differences, solvent swelling, evaporation of under-cured film during high temp bake, etc.). A cured film 524 with features having uniform mechanical and etch properties is preferable for process stability and predictable quality and yield.

Defocusing the actinic radiation coming from the SLM is one solution but comes at the price of extrusion control. One of the advantages of using an SLM in a nanoimprint lithography system 100 is to improve the spatial control of the dose of actinic radiation that formable material receives when it is near the mesa sidewalls 246 and when it is not under the shaping surface 112. This advantage is reduced when the actinic radiation from the SLM is defocused.

Combined Image Intensity

The applicant has determined that variation in the actinic radiation dosage received by the formable material can be alleviated by the use of two images (image #1 and image #2) of a single SLM. In order to reduce the variation, the radiation patterns from a first image of the SLM (image #1) and the second image of the SLM (image #2) may be arranged in a particular manner that reduces the variation.

Figure 6A:
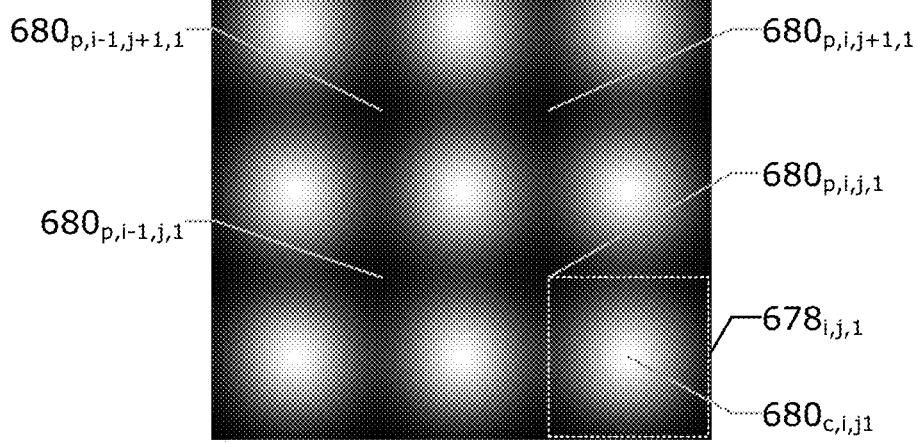
FIGS. 6A-I are simulated spatial distributions of actinic radiation as used in embodiments.

FIG. 6A is an illustration of a first simulated actinic radiation pattern 676a as would be received by formable material when modulation elements of the SLM 448 are in the on position and form a set of beamlets from image #1 of the SLM. Each modulation element of the SLM 448 is associated with two particular regions of the formable material (from image #1 and image #2). For example, particular modulation element $M_{i,j,1}$ at address i,j of the SLM in the image #1 is associated with subpattern $678_{i,j,1}$ as outlined with a dotted box in FIG. 6A. In the simulation illustrated in FIG. 6A, each subpattern $678_{i,j,1}$ is represented by a Gaussian intensity distribution with a standard deviation of 15 µm tiled on a pitch of 66 µm. The applicant has found that a Gaussian intensity distribution is a reasonable approximation of the beamlets produced by each modulation element. In an alternative simulation, each subpattern may be represented by an image of the mirror convolved with a function that represents the performance of the optical system. Each subpattern has a center point $680_{c,i,j,1}$ that is associated with the center of the subpattern $678_{i,j,1}$ as illustrated in FIG. 6A. Each set of four subpatterns of the SLM 448 has an interstitial point $680_{p,i,j,1}$ centered between each of four neighboring subpatterns. There is a first set of subpatterns $678_1$ that are tiled across image #1 produced at the plane of the formable material by the SLM 448. There is a first set of center points $680_{c,1}$ that are also tiled across image #1 produced at the plane of the formable material by the first SLM 448 centered on each subpattern. There is a first set of interstitial points $680_{p,1}$ that are also tiled across image #1 produced at the plane of the formable material by the SLM 448 at the intersections of four subpatterns.

Figure 6B:
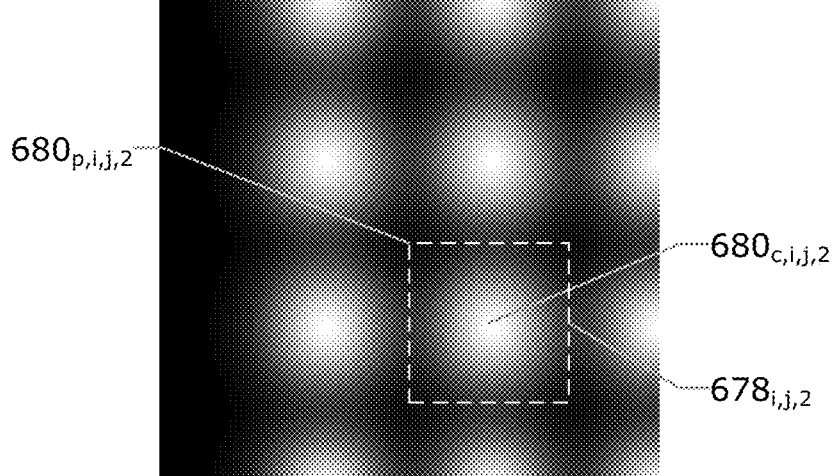

FIG. 6B is an illustration of a second simulated actinic radiation pattern 676b as would be received by formable material when modulation elements of the SLM 448 are in the on position and form a set of beamlets in image #2 of the SLM that has been offset from image #1. One exemplary component that may be used for offsetting image #2 relative to image #1 is the tilted glass plate 466. For example, a particular modulation element $M_{i,j}$ at an address i,j of SLM in image #2 is associated with subpattern $678_{i,j,2}$ as outlined with a dashed box in FIG. 6B. Each subpattern $678_{i,j,2}$ is represented by a Gaussian intensity distribution with a standard deviation of 15 µm in the simulation illustrated in FIG. 6B tiled on a pitch of 66 µm. Each subpattern has a center point $680_{c,i,j,2}$ that is associated with the center of the subpattern as illustrated in FIG. 6B. Each set of four subpatterns in image #2 of the SLM 448 has an interstitial point $680_{p,i,j,2}$ centered between each of four neighboring subpatterns. There is a second set of subpatterns $678_2$ that are tiled across image #2 produced at the plane of the formable material by the SLM 448. There is a second set of center points $680_{c,2}$ that are also tiled across image #2 produced at the plane of the formable material by the SLM 448 centered on each subpattern. There is a second set of interstitial points $680_{p,2}$ that are also tiled across image #2 produced at the plane of the formable material by the SLM 448 at the intersections of four subpatterns. In an embodiment, an image of the SLM 488 has been split by a beam splitter 462 into image #1 and image #2.

Figure 6C:
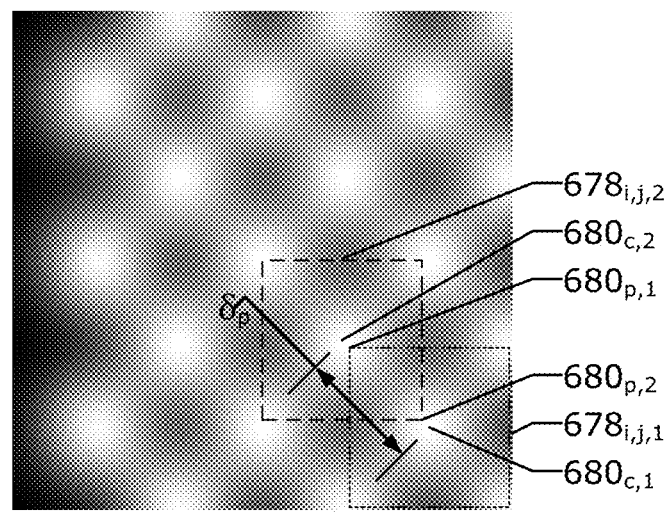

FIG. 6C is an illustration of a simulated combined actinic radiation pattern 676c which may exit the fourth beam combiner. The first simulated actinic radiation pattern 676a (image #1) and the second simulated actinic radiation pattern 676b (image #2) are combined with each other by the fourth beam combiner to form a combined image (image C). The radiation patterns (676a and 676b) are aligned such that the second set of center points $680_{c,2}$ of the subpatterns of the second simulated actinic radiation pattern 676b are substantially aligned with the first set of interstitial points $680_{p,1}$ of the first simulated actinic radiation pattern 676a. In an embodiment, the alignment accuracy of the second set of center points $680_{c,2}$ with the first set of interstitial points $680_{p,1}$ is better near the mesa sidewalls than near the center of patterning surface. In the context of the present disclosure, aligned means within the alignment capability of the optical system projecting images of the modulation elements onto the plane of the formable material. The alignment may be accomplished by controlling a projected lateral beam displacement $\delta_p$, which is the offset of image #2 relative to image #1 at the plane of the formable material. In an embodiment, the projected lateral beam displacement $\delta_p$ is a function of the lateral beam displacement $\delta$ and a magnification factor (M) of the optical system ($\delta_p = f(\delta, M)$). In an embodiment, the projected lateral beam displacement $\delta_p$ is a linear function of the lateral beam displacement $\delta$ and a magnification factor (M) of the optical system ($\delta_p = \delta \times M$). In an embodiment, the lateral beam displacement $\delta$ may be controlled by controlling the angle θ of the tilted glass plate 466.

In an embodiment, there is a first set of first projected subpatterns that are tiled with a first pitch to from a first projected pattern of actinic radiation at the plane of the formable material produced by image #1 of the SLM. There is also a second set of second projected subpatterns that are tiled with a second pitch to from a second projected pattern of actinic radiation at the plane of the formable material produced by image #2 of the SLM. In an embodiment, the difference between the first pitch and the second pitch is less than 3% of the first pitch.

There are a first set of center points positioned at the center of each projected subpattern in the first set of projected subpatterns. There are a second set of center points positioned at the center of each projected subpattern in the second set of projected subpatterns. There are a first set of interstitial points positioned equidistant from center points of neighboring projected subpatterns in the first set of projected subpatterns. There are 4 nearest neighboring projected subpatterns for square modulation elements, this number can change depending on the shape of the modulation element. There are a second set of interstitial points positioned equidistant between neighboring projected subpatterns in the second set of projected subpatterns.

In an embodiment, a distance between a first set of interstitial points and a second set of center points is less than 6.5 µm. In an embodiment, a distance between a first set of interstitial points and a second set of center points is less than 3% of the first pitch. In an embodiment, a distance between a first set of interstitial points and a second set of centers is less than 3% of the second pitch.

In an embodiment, the first projected subpattern is focused at the plane of the formable material and the second projected pattern is defocused at the plane of the formable material. A lens assembly 467 may be used to control the defocus of image #1 relative to image #2. The second set of subpatterns are also defocused and include intensity peaks that are positioned near the first set of interstitial points in the interior of the patterning area. The second set of subpatterns are arranged so that they do not cure formable material outside the mesa sidewalls do not project outside the patterning region.

In an embodiment, there are additional lens assemblies for changing magnification of the combined image output by the fourth beam combiner 452d.

Figure 6D:
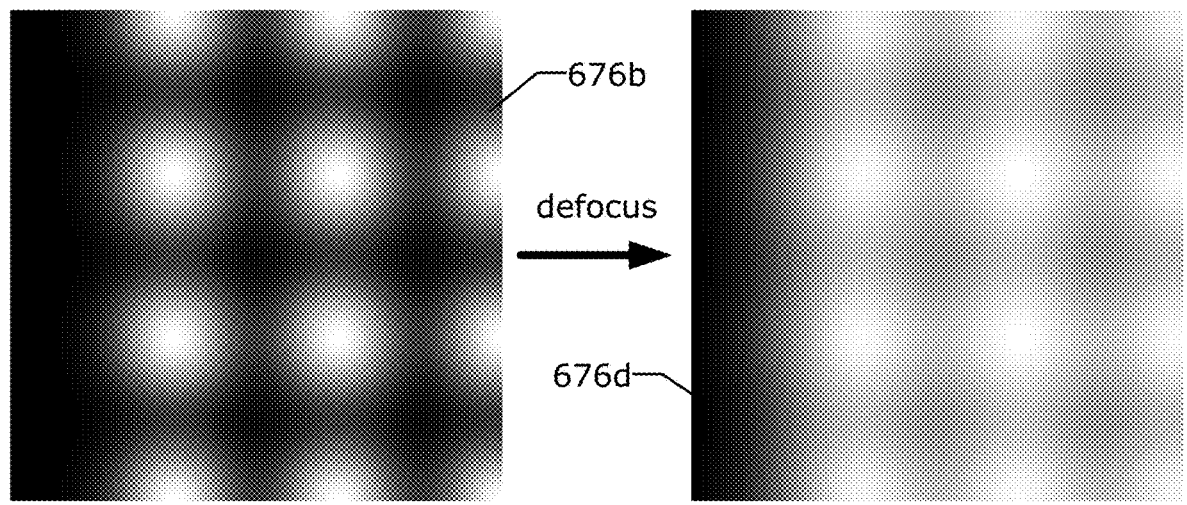

FIG. 6D is an illustration of the second simulated actinic radiation pattern 676b that is defocused by the lens assembly 467 to obtain a third defocused simulated actinic radiation pattern 676d as would be received by formable material when modulation elements of image #2 of the SLM 448 are in the on position and the radiation pattern is not focused at the plane of the formable material. In an embodiment, the focal plane of the image #2 of the SLM is above or below the focal plane of image #1 of the SLM 448, while the magnification of image #1 of the SLM 448 is the same as image #2 of the SLM 448 at the plane of the formable material. Each subpattern $678_{i,j,2}$ is also defocused forming a defocused subpattern $682_{i,j,2}$ that is tiled across the shaping surface 112 which is the second set of defocused subpatterns $682_2$. In the simulation illustrated in FIG. 6D, each defocused subpattern $678_{i,j,2}$ is represented by a Gaussian intensity distribution with a standard deviation of 25 µm tiled on a pitch of 66 µm. Note that even though the standard deviation associated with the subpattern changes, the projected pitch does not change.

In an embodiment, one lens assembly 467 for changing the plane of focus is placed in one of the projection paths after the beam splitter 462 and before the fourth beam combiner 452d. In an embodiment, the projected pitch of the projected subpatterns from each modulation element of the SLM at the plane of the formable material is measured and/or calculated from one or both the images #1 and #2 of the SLM. In an embodiment, the projected subpatterns from one of the two images (#1 and #2) of the SLM are focused onto the plane of the formable material. In an embodiment, a focal plane of the modulation elements of the SLM from one of the two images (#1 and #2) are within a first threshold distance of the plane of the formable material under the template.

In an embodiment, there are two different lens assemblies, one for each projection path. Different lens assemblies are placed in each the projection paths between the beam splitter 462 and the fourth beam combiner 452d. Each lens assembly may be configured to control both the pitches associated with each of the two images (#1 and #2) of the SLM projected onto the plane of the formable material while also separately controlling the blurriness of those subpatterns in those images. The blurriness of the second set of projected subpatterns $678_2$ can be controlled by shifting the focal plane relative to the plane of the formable material while also controlling the magnification at the plane of the formable material so that the first pitch and the second pitch match are within 3% of each other.

Figure 6E:
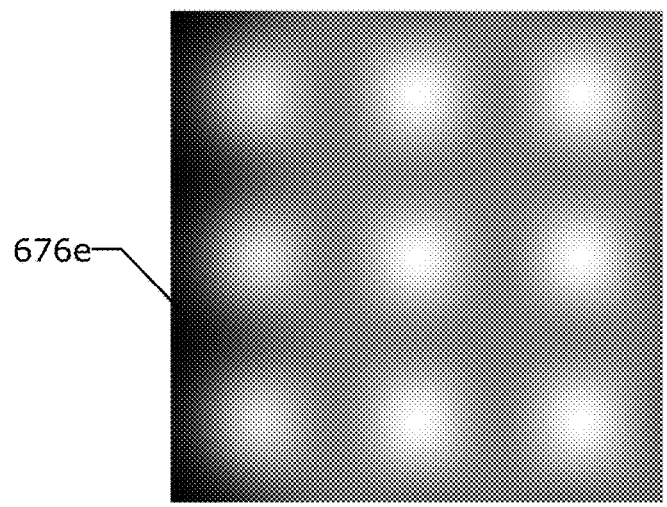

FIG. 6E is an illustration of a simulated combined actinic radiation pattern 676e in which the first simulated actinic radiation pattern 676a and the third defocused simulated actinic radiation pattern 676d are combined with each other. The radiation patterns (676a and 676d) are aligned such that the second set of center points $680_{c,2}$ of the second set of defocused subpatterns $682_2$ of the third defocused simulated actinic radiation pattern 676d are substantially aligned with the first set of interstitial points $680_{p,1}$ of the first simulated actinic radiation pattern 676a as described above.

In an embodiment, the beam splitter 462 and/or the fourth beam combiner 452d are optical switches. The combined image is a time averaged image. Individual modulation elements 570 of the SLM 448 have different modulation periods such that there is a spatial distribution of the dosage of actinic radiation received by the formable material. In an embodiment, the spatial distribution of the dosage of actinic radiation is controlled by adjusting, the duty cycle of modulation elements of DMD type SLM while each of image #1 and image #2 are projected at the plane of the formable material. In an embodiment, the spatial distribution of the dosage of actinic radiation is controlled by adjusting, the duty cycle and transmissivity of modulation elements of a transmissive type SLM (such as an LCD). In an embodiment, the spatial distribution of the dosage of actinic radiation is controlled by adjusting, the duty cycle and reflectivity of modulation elements of a reflective type SLM (such as an LCoS).

FIG. 6E is an illustration of a simulated combined actinic radiation pattern 676e. In which the first set of focused subpatterns $678_1$ from image #1 of SLM 448 and the second set of defocused subpatterns $682_2$ from image #2 are combined. The first set of focused subpatterns $678_1$ has a focal plane that is close to the plane of the formable material. In an embodiment, the beamlet spots associated with the first set of focused subpatterns $678_1$ is less than a pitch of the first set of focused subpatterns $678_1$. In an embodiment, the second set of defocused subpatterns $682_2$ have a focal plane that is farther from the plane of the formable material than the focal plane of the first set of focused subpatterns $678_1$. In an embodiment, beamlet spots associated with the second set of defocused subpatterns $682_2$ is greater than a pitch of the first set of focused subpatterns $678_1$. In an embodiment, beamlet spots associated with the second set of defocused subpatterns $682_2$ is greater than a pitch of the second set of focused subpatterns $678_2$. In an embodiment, beamlet spots associated with the second set of defocused subpatterns $682_2$ is greater than beamlet spots associated with the first set of focused subpatterns $678_1$ as illustrated in FIGS. 6A and 6D-E. In an embodiment, beamlet spots associated with the second set of defocused subpatterns $682_2$ are inset away from the mesa sidewalls 246 a greater distance than beam spots associated with the first set of focused subpatterns $678_1$ as illustrated in FIGS. 6A and 6D-E.

One method of controlling extrusions relies on controlling the amount of actinic radiation received by the formable material near the mesa sidewalls. One method of characterizing the spatial distribution of the actinic radiation received by the formable material near the mesa sidewalls is the amount of blur associated with each modulation element of the actinic radiation produced at the plane of the formable material. The amount of blur depends on: the reflective properties of each SLM; the divergence of the actinic radiation incident on the SLM; the optical performance of the optical components which guide the actinic radiation to the formable material; and the distance of the focal plane from the plane of the formable material. Some blur is tolerable and even advantageous. The effect that blur has on extrusion control depends on several factors, such as the local intensity at the mesa sidewalls 246, total applied dose, formable material curing properties; sensitivity of the formable material to the wavelength of the actinic radiation; gas environment near the mesa sidewalls 246; spectral distribution of the actinic radiation; etc.

The actinic radiation sources are configured to illuminate the SLMs with a broad beam of actinic radiation. The SLMs then transform the broad beam of actinic radiation into a set of beamlets. Each beamlet in the set of beamlets is then guided to the formable material by optical components. Each beamlet may be approximated by an ideal gaussian beamlet that propagates along an optical path until it reaches the formable material. For each ideal gaussian beamlet there is an image plane intersecting with the optical path in which the beam waist of the ideal gaussian beamlet is at a minimum. Adjusting the size of the beamlet spot then depends on the distance of the image plane from the plane of the formable material.

Figure 6F:
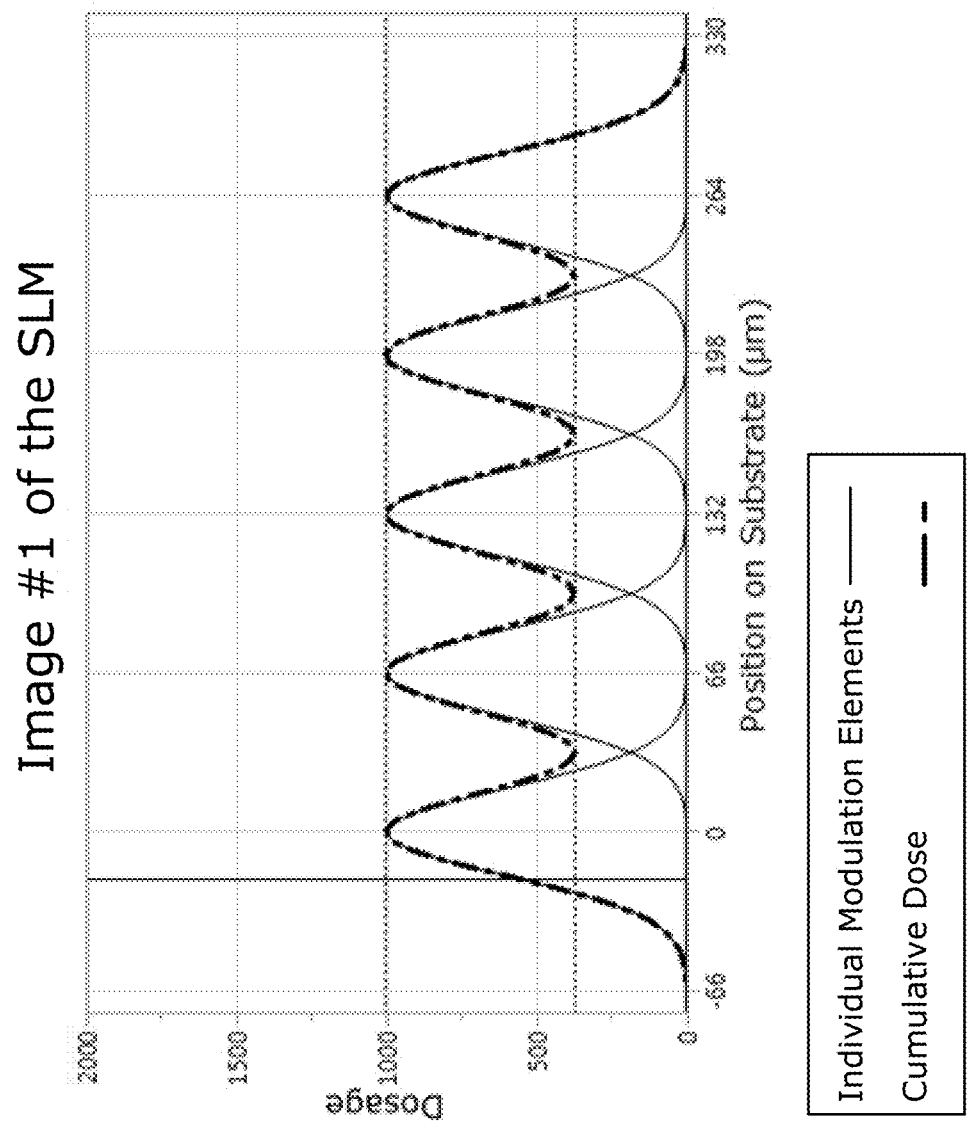
Figure 6G:
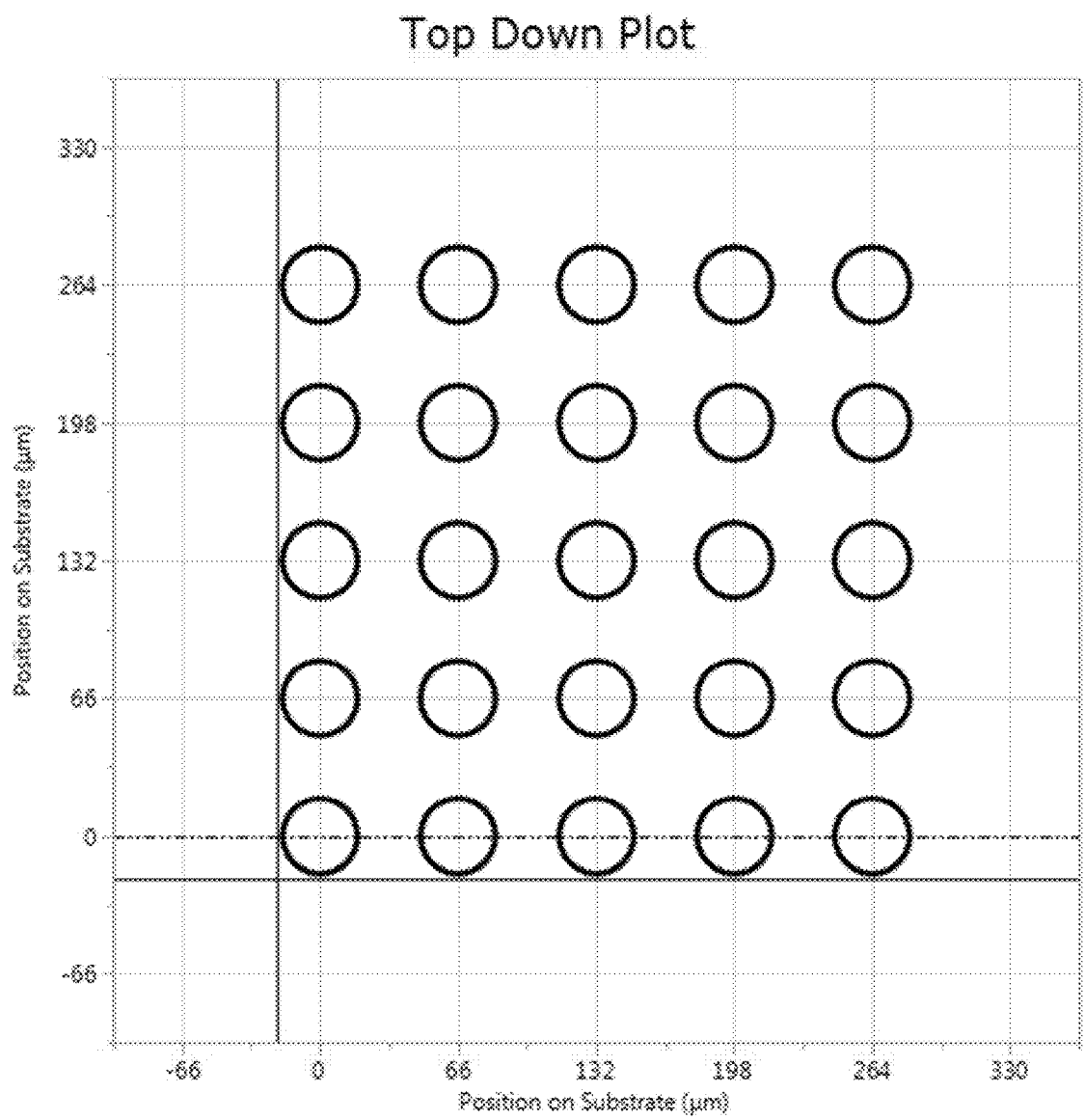

FIG. 6F is an illustration of a cross section of 5 simulated subpatterns of actinic radiation at the plane of the formable material (solid line) and a simulated cumulative dosage of actinic radiation at the plane of the formable material (dash-dot line) produced by the five modulation elements at the plane of the formable material under the shaping surface 112 from image #1 of the SLM 448. The spatial distribution of the actinic radiation is approximated with a gaussian distribution of actinic radiation with a standard deviation of 18 μm and a 66 μm pitch. Note that the variation in the cumulative dosage between a center point and an interstitial point is 50%. FIG. 6G is an illustration of the arrangement of one standard deviation intensity contours of 25 simulated subpatterns of actinic radiation at the plane of the formable material.

Figure 6H:
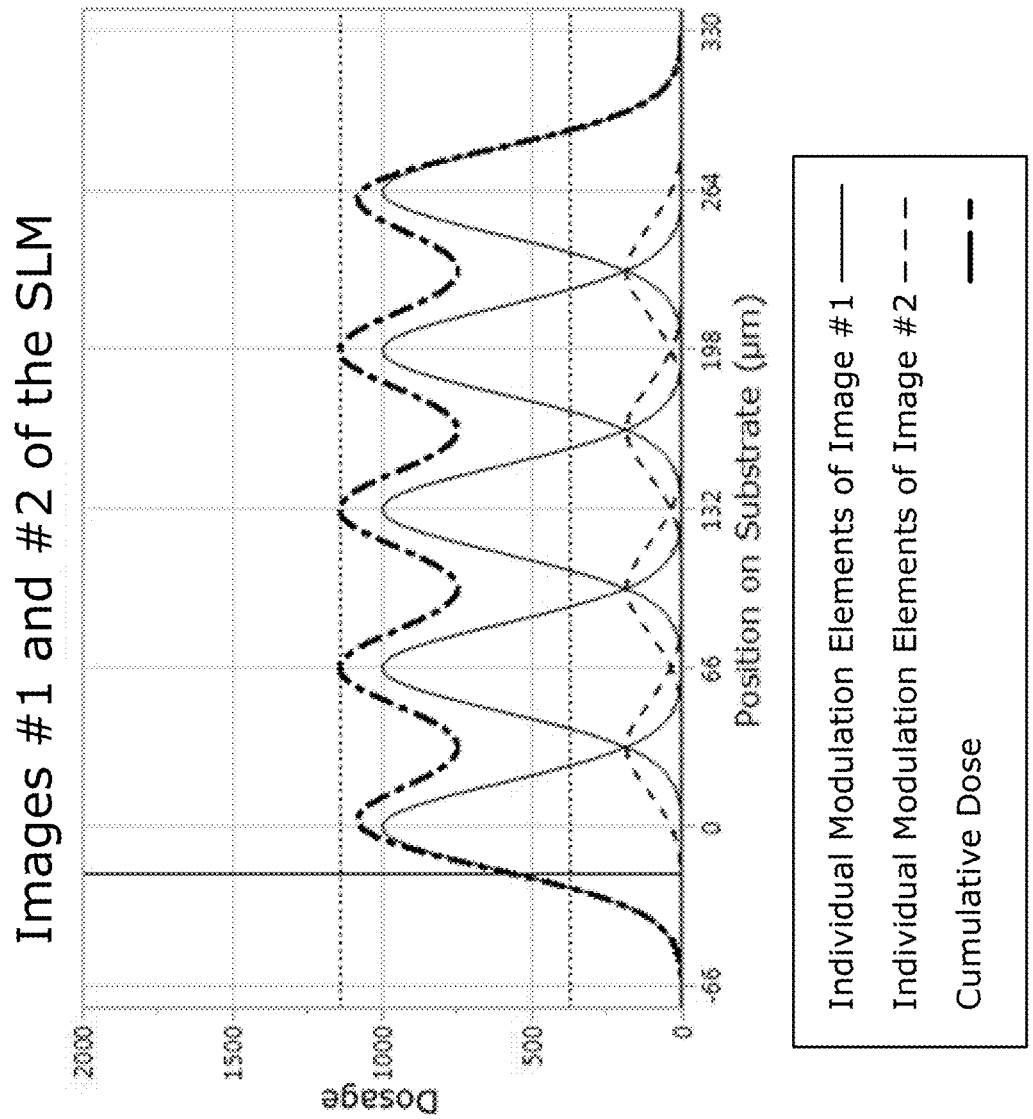
Figure 6I:
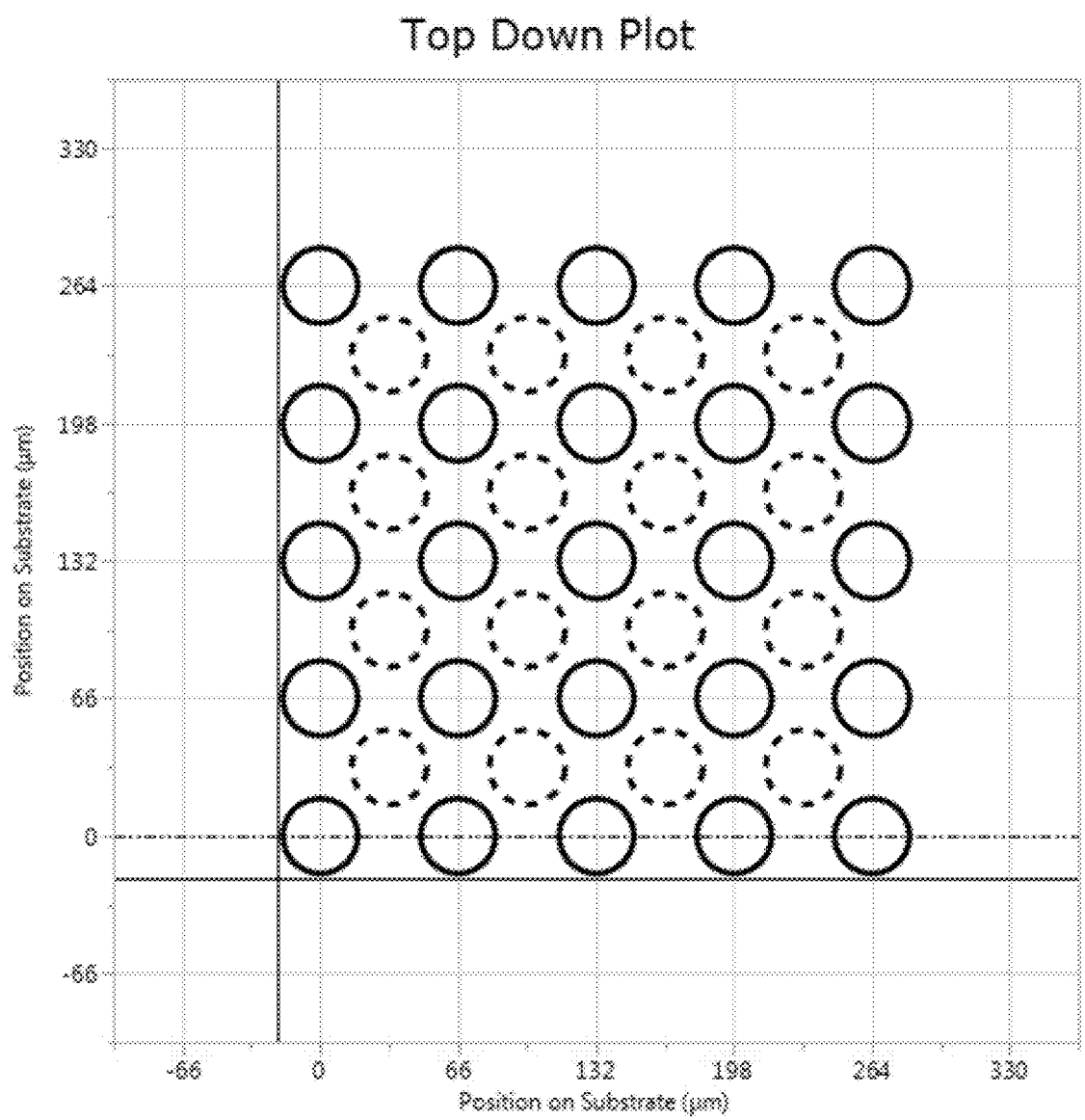

FIG. 6H is an illustration of: a cross section of 5 simulated subpatterns of actinic radiation at the plane of the formable material from image #1 of SLM 448 (solid line); 4 simulated subpatterns of actinic radiation at the plane of the formable material from image #2 of the SLM 448 (dashed line) which has been trimmed by an aperture; and a cumulative dosage of actinic radiation produced by five modulation elements from the first SLM and 4 modulation elements of the second SLM at the plane of the formable material under the shaping surface 112 (dash-dot line). The spatial distribution of the actinic radiation is approximated with a gaussian distribution of actinic radiation with a standard deviation of 20 μm and a 66 μm pitch. Note that the variation in the cumulative dosage between a center point and an interstitial point is reduced to 30% while the decay rate of the dosage near the mesa sidewalls is unaffected. FIG. 6I is an illustration of the arrangement of one standard deviation intensity contours of 25 simulated subpatterns of actinic radiation from image #1 of the SLM 448 and 16 simulated subpatterns of action radiation from image #2 of the SLM 448 (which has been trimmed by an aperture) both at the plane of the formable material.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A shaping system comprising:
    a spatial light modulator;
    a radiation source configured to illuminate the spatial light modulator with actinic radiation;
    a beam splitter configured to receive actinic radiation from the spatial light modulator and emit a first image of the spatial light modulator and a second image of the spatial light modulator, wherein the first image is a part of the actinic radiation received from the spatial light modulator, and the second image is another part of the actinic radiation received from the spatial light modulator;
    a beam combiner configured to receive the first image and the second image and emit a combined image that includes:
       the first image; and
       the second image, wherein the second image is offset from and overlapping with the first image; and
    a projection system configured to receive the combined image and illuminate formable material between a template and a substrate with a projected image at a plane of the formable material.

2. The shaping system according to claim 1, wherein:
    the spatial light modulator has a plurality of modulation elements;
    a modulation element pitch is a shortest distance between neighboring modulation elements among the plurality of modulation elements;
    the projected image includes:
       a first projected image of the spatial light modulator having a first pitch that is shortest distance between images of neighboring modulation elements in the first projected image at the plane of the formable material;
       a second projected image of the spatial light modulator having a second pitch that is shortest distance between images of neighboring modulation elements in the second projected image at the plane of the formable material;
       wherein the first projected image is offset from the second projected image by half of the first pitch.

3. The shaping system according to claim 2, wherein a percent difference between the first pitch and the second pitch is less than 3%.

4. The shaping system according to claim 1, further comprises:
    a tilted window that controls the offset of the second image relative to the first image, wherein the tilted window is in an optical path between the beam splitter and the beam combiner.

5. The shaping system according to claim 1, further comprises:
    one or more mirrors arranged to guide the second image to the beam combiner such that the second image is offset from and overlapping with the first image at the beam combiner.

6. The shaping system according to claim 1, wherein the spatial light modulator is: a digital micromirror device (DMD); a liquid crystal on silicon (LCoS) device; or a liquid crystal display (LCD).

7. The shaping system according to claim 1, wherein:
    the beam splitter is a first surface of an optical component; and
    the beam combiner is a second surface of the optical component.

8. The shaping system according to claim 7, wherein the optical component includes a plurality of surfaces which guide the second image to the second surface such that the second image is offset from the first surface at the second surface.

9. The shaping system according to claim 1, wherein:
    the beam splitter is a polarizing beam splitter; and
    the beam combiner is a polarization beam combiner.

10. The shaping system according to claim 1, wherein the beam splitter is a cube beam splitter or a plate beam splitter.

11. The shaping system according to claim 1, further comprising:
    a thermal radiation source configured to illuminate the spatial light modulator with thermal radiation;
    wherein the first image travels along a first path between the beam splitter and the beam combiner;
    wherein the beam splitter is further configured to receive thermal radiation from the spatial light modulator and emit a third image of the spatial light modulator along the first path towards the beam splitter;
    wherein a first ratio is an intensity of the actinic radiation in the first image emitted by the beam splitter divided by an intensity of actinic radiation received by the beam splitter;
    wherein a second ratio is an intensity of the thermal radiation in the third image emitted by the beam splitter divided by an intensity of thermal radiation received by the beam splitter; and
    wherein the second ratio is at least 30% greater than the first ratio.

12. The shaping system according to claim 1, further comprising:
    a template chuck configured to hold the template;
    a substrate chuck configured to hold the substrate;
    a dispensing system configured to dispense the formable material onto the substrate;
    a positioning system configured to bring the template into contact with formable material;
    a second actinic radiation source configured to supply additional actinic radiation to the formable material between the template and the substrate to cure the formable material.

13. The shaping system according to claim 1, further comprising:
    one or more optical components between the beam splitter and the beam combiner; and
    wherein the one or more optical components adjust a first set of optical properties at the plane of the formable material of the first image to be different than a second set of optical properties at the plane of the formable material of the second image.

14. The shaping system according to claim 13, wherein:
    the first set of the optical properties includes a first distance between a focal plane of the first image and the plane of the formable material;
    the second set of the optical properties includes a second distance between a focal plane of the second image and the plane of the formable material; and
    first distance is different from the second distance.

15. The shaping system according to claim 13, wherein:
    the first set of the optical properties includes a first position of the first image at the plane of the formable material;
    the second set of the optical properties includes a second position of the second image at the plane of the formable material; and a difference between the first position and the second position is a projected lateral beam displacement is less than a projected modulation element pitch of the spatial light modulator.

16. The shaping system according to claim 13, wherein:
the first set of the optical properties includes a first projected pitch between the images of modulation elements in the first image at the plane of the formable material;
the second set of the optical properties includes a second projected pitch between the images of modulation elements in the second image at the plane of the formable material; and
a percent difference between the first projected pitch and the second projected pitch is less than 3%.

17. The shaping system according to claim 13, wherein:
the first set of the optical properties includes:
a first average distance of a focal plane of the first image from the plane of the formable material; and
a first size of the first image at the plane of the formable material;
the second set of the optical properties includes:
a second average distance of a focal plane of the second image from the plane of the formable material; and
a second size of the second image at the plane of the formable material;
the first average distance is greater than the second average distance; and
the first size is less than the second size.

18. The shaping system according to claim 13, wherein the one or more optical components includes an aperture which reduces a size of the first image.

19. A shaping method comprising:
illuminating a spatial light modulator with actinic radiation;
receiving, by a beam splitter, actinic radiation from the spatial light modulator; emitting, by the beam splitter, a first image of the spatial light modulator and a second image of the spatial light modulator, wherein the first image is a part of the actinic radiation received from the spatial light modulator, and the second image is another part of the actinic radiation received from the spatial light modulator;
receiving, by a beam combiner, the first image and the second image
emitting, by the beam combiner, a combined image that includes:
the first image; and
the second image, wherein the second image is offset from and overlapping with the first image;
receiving, by a projection system, the combined image; and
illuminating, by the projection system, formable material between a template and a substrate with a projected image at a plane of the formable material.

20. A method of manufacturing an article using the shaping method according to claim 19, wherein illuminating the formable material with actinic radiation causes the formable material to be cured, wherein the method of manufacturing the article further comprises:
processing the cured formable material on the substrate; and
forming the article from the processed substrate.

* * * * *

UNITED STATES PATENT AND TRADEMARK OFFICE
CERTIFICATE OF CORRECTION

| | | |
|---|---|---|
| PATENT NO. | : 11,747,731 B2 | |
| APPLICATION NO. | : 17/100477 | |
| DATED | : September 5, 2023 | |
| INVENTOR(S) | : James W. Irving et al. | |

It is certified that error appears in the above-identified patent and that said Letters Patent is hereby corrected as shown below:

On the Title Page

Item (73), in Column 1, in "Assignee", Line 1, please delete "KABISHIKI" and insert
--KABUSHIKI--

Signed and Sealed this
Fifteenth Day of October, 2024

Katherine Kelly Vidal
*Director of the United States Patent and Trademark Office*